(12) United States Patent
Yamato et al.

(10) Patent No.: US 10,992,294 B2
(45) Date of Patent: Apr. 27, 2021

(54) DRIVER DEVICE

(71) Applicant: Rohm Co., Ltd., Kyoto (JP)

(72) Inventors: Tetsuo Yamato, Kyoto (JP); Noboru Takizawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/583,908

(22) Filed: Sep. 26, 2019

(65) Prior Publication Data
US 2020/0106433 A1 Apr. 2, 2020

(30) Foreign Application Priority Data

Oct. 1, 2018 (JP) .............................. JP2018-186415

(51) Int. Cl.
*H02P 1/00* (2006.01)
*H03K 17/16* (2006.01)
*H02P 7/03* (2016.01)

(52) U.S. Cl.
CPC ............. *H03K 17/162* (2013.01); *H02P 7/04* (2016.02)

(58) Field of Classification Search
CPC ......... G05B 17/02; H02P 29/60; H02P 27/04; H02P 27/08; H02P 29/032; H02P 29/68; H02P 6/085

See application file for complete search history.

(56) References Cited

U.S. PATENT DOCUMENTS

| 7,304,828 B1 * | 12/2007 | Shvartsman | H02H 3/085 |
| | | | 361/93.1 |
| 2009/0167357 A1 * | 7/2009 | Lai | H03K 19/018585 |
| | | | 326/82 |

FOREIGN PATENT DOCUMENTS

JP 2008220081 9/2008

* cited by examiner

*Primary Examiner* — Karen Masih
(74) *Attorney, Agent, or Firm* — Fish & Richardson P.C.

(57) ABSTRACT

The present disclosure relates to a driver device, which can drive a load in high temperatures. In a driver IC which drives a motor by switch-driving four output transistors, a gate driving circuit is configured to render a slew rate of a gate voltage of each output transistor to be adjustable at multiple steps while the output transistor is switching. Although a predetermined rate is set to be the slew rate of the gate voltage in a normal state, the slew rate is increased at high temperatures.

12 Claims, 12 Drawing Sheets

| Actual slew rate $SR_{UP}$ according to SOURCE[4:0] | $I_{SOURCE}$ |
|---|---|
| $1^{st}$ slew rate | 1mA |
| $2^{nd}$ slew rate | 2mA |
| $3^{rd}$ slew rate | 3mA |
| . | . |
| . | . |
| . | . |
| $30^{th}$ slew rate | 30mA |
| $31^{st}$ slew rate | 31mA |

| Actual slew rate $SR_{DWN}$ according to SINK[4:0] | $I_{SINK}$ |
|---|---|
| $1^{st}$ slew rate | 1mA |
| $2^{nd}$ slew rate | 2mA |
| $3^{rd}$ slew rate | 3mA |
| . | . |
| . | . |
| . | . |
| $30^{th}$ slew rate | 30mA |
| $31^{st}$ slew rate | 31mA |

DRIVER DEVICE

BACKGROUND OF THE INVENTION

Field of the Invention

The present disclosure relates to a driver device.

Description of the Prior Art

In a system (e.g., refer to Patent document 1) which includes an output transistor connected in series to a load such as a motor and powers the load by switch-driving the output transistor, a situation where a slew rate of the gate voltage of the output transistor needs to be adjusted exists.

By suppressing the slew rate to a lower value, it is aimed to suppress electric wave radiation related to electromagnetic interference (EMI). On the other hand, the decrease in slew rate causes an increase in loss of the output transistor. Considering and comparing the above, there is a need for a method for setting the slew rate to an expected slew rate.

PRIOR ART DOCUMENT

Patent Document

[Patent document 1] Japan Patent Publication No. 2008-220081

SUMMARY OF THE INVENTION

Problems to be Solved by the Invention

In said method, a temporarily set slew rate has a constant value, and thus the amount of heat emitted by the output transistor is also constant. However, there are cases where a constant slew rate is inappropriate. For example, when a slew rate suitable in a normal-temperature environment is directly applied to a high-temperature environment, there is a risk that the temperature of the output transistor can get too high such that the output transistor becomes damaged as a result, or switch-driving of the output transistor is needs to be terminated due to safety considerations. Therefore, it is expected that a technique for appropriating a slew rate of a gate voltage can be developed.

It is an object of the present invention to provide a temperature-associated driver device that helps appropriating a slew rate of a gate voltage.

Technical Means for Solving the Problems

A driver device of the present invention switch-drives a target transistor connected to a load in series, and is characterized in comprising: a gate driver circuit, being a circuit for controlling a gate voltage of the target transistor, configured to render a slew rate of the gate voltage of each output transistor to be adjustable at multiple steps while the output transistor is switching; and a slew rate setting circuit, configured to adjustably set the slew rate according to a temperature signal corresponding to a target temperature, wherein the target temperature has a relationship with the temperature of the target transistor.

More specifically, for example, the following situation can exist in the driver device: the gate driver circuit is capable of rendering the slew rate to change among multiple rates including a first rate and a second rate greater than the first rate, in a state where the slew rate is set to the first rate, when a specific change representing a rise in the target temperature occurs in the temperature signal, the slew rate setting circuit changes the slew rate to the second rate.

Further, for example, the following situation can exist in the driver device: the gate driver circuit supplies electric charge to the gate of the target transistor by a constant current or draws electric charge from the gate of the target transistor to cause the state of the target transistor to switch between a disconnected state and a connected state, and to render the slew rate to be adjustable by changing a value of the constant current.

Further, more specifically, for example, in the driver device, it can be said that: the target temperature also rises or drops as the temperature of the target transistor rises or drops, or the temperature of the target transistor also rises or drops as the target temperature rises or drops.

Further, more specifically, for example, the following situation can exist in the driver device: the target temperature is the temperature of the target transistor or is the ambient temperature of the driver device, and the temperature signal is obtained by a temperature detection circuit, wherein the temperature detection circuit is connected to the driver device or provided in the driver device and used for detecting the target temperature.

At this point, for example, the following situation can exist in the driver device: a circuit group including the gate driver circuit and the slew rate setting circuit forms a semiconductor integrated circuit (IC), multiple external terminals including an output terminal and a temperature signal terminal are provided in a housing of the semiconductor integrated circuit, the target transistor and the temperature detection circuit are provided on the outside of the semiconductor IC, the gate driver circuit is connected to the gate of the target transistor by the output terminal, and the temperature detection circuit is connected to the temperature signal terminal.

Further, for example, the following situation can exist in the driver device: an original temperature signal having a voltage corresponding to the target temperature is inputted from the temperature detection circuit to the temperature signal terminal, and the slew rate setting circuit adjustable sets the slew rate according to a comparison result of the voltage of the original temperature signal inputted to the temperature signal terminal and a specified reference voltage.

Alternatively, for example, the following situation can exist in the driver device: a circuit group including the gate driver circuit, the slew rate setting circuit and the target transistor forms a semiconductor IC, and the temperature detection circuit and the target transistor are provided in a common housing.

Further, for example, the following situation can exist: the driver device forms a full bridge circuit capable of driving a direct-current (DC) motor relatively serving as the load, the four output transistors forming the full bridge circuit respectively serve as the target transistor and exercise functions thereof, a relationship exists between the respectively target temperatures and the temperatures of the output transistors, the gate driver circuit controls the respective gate voltages of the output transistors, and the slew rate setting circuit adjustably sets the slew rate of the gate voltage of each of the output transistors according to the temperature signal corresponding to the target temperature.

Further, for example, in the driver device, the load can be a DC motor.

Further, for example, in the driver device, the DC motor can be used to drive a cooling fan of specified parts.

Effects of the Invention

According to the present invention, a temperature-associated driver device which helps appropriating a slew rate of a gate voltage is provided.

DETAILED DESCRIPTION OF THE EMBODIMENTS

Examples of embodiments of the present invention are described in detail with the accompanying drawings below. In the reference drawings, same denotations are given to the same parts, and repeated description related to the same parts are in principle omitted. Further, in the description, to keep illustrations simple, signs or symbols for reference information, signals, physical quantities or parts are given, and names of the information, signals, physical quantities or parts corresponding to the signs or symbols are hence omitted or simplified. For example, a gate connecting terminal (referring to FIG. 1) referred to by "G[1]" is sometimes denoted as a gate connecting terminal G[1] and is sometimes simply denoted as a terminal G[1], in both cases referring to the same object.

Firstly, several terms used in the description of the embodiments are explained. The term "ground" refers to a conductive portion having a 0 V reference potential, or refers to a reference potential itself. In the embodiments, a voltage represented without a specifically provided reference is a potential using ground as a reference. The terms "line" and "wire" have the same meaning. The term "level" refers to a level of electric potential, and for any signal or voltage, a high level has an electric potential higher than that of a lower level. With respect to any transistor forming a field effect transistor (FET) including a metal-oxide-semiconductor field effect transistor (MOSFET), a connected state means that the drain and the source of the transistor are in a conducted state therebetween, and a disconnected state means that drain and the source of the transistor are in a non-conducted state (a disconnected state) therebetween. A connected state and a disconnected state are sometimes simply expressed as connected and disconnected.

Fundamental Embodiment

Figure 1:
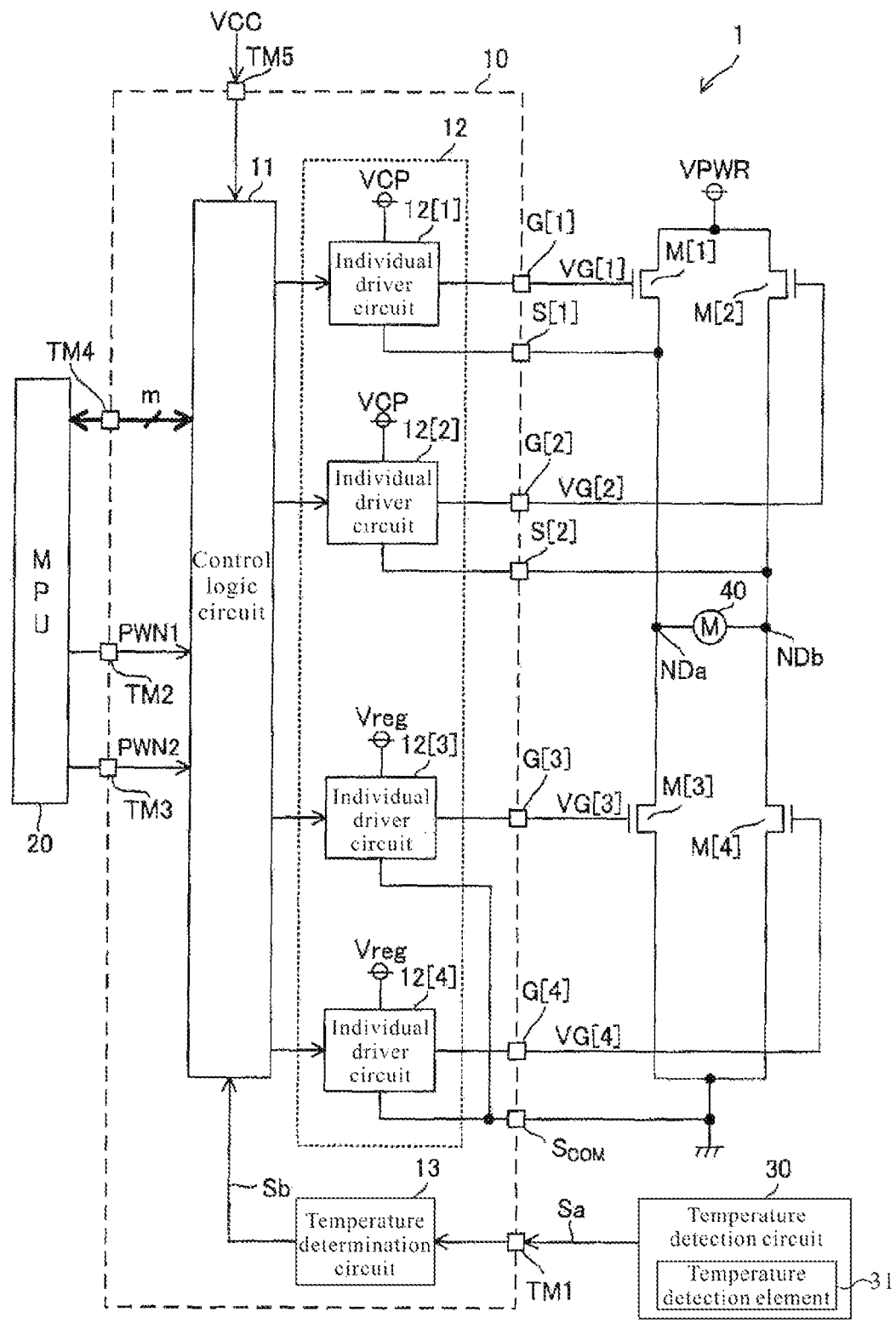
FIG. 1 is a schematic diagram of a motor driver system according to a fundamental embodiment of the present invention.

A fundamental embodiment of the present invention is described below. FIG. 1 shows a schematic diagram of a motor driver system 1 according to a fundamental embodiment of the present invention. The motor driver system 1 includes a driver integrated circuit (IC) 10, a microprocessing unit (MPU) 20, a temperature detection circuit 30, a motor 40 and output transistors M[1] to M[4]. The MPU 20, the temperature detection circuit 30 and the output transistors M[1] to M[4] are provided on the outside of the driver IC 10, and are externally connected to the driver IC 10. The motor 40 serves as a brush direct-current (DC) motor for a load of the driver IC 10.

The driver IC 10 includes a control logic circuit 11, a gate driver circuit 12 and a temperature determination circuit 13. In addition, the driver IC 10 is further provided with circuits such as a charge pump circuit for generating a necessary voltage, a circuit for detecting whether an overcurrent flows through each output transistor, etc., with however drawings thereof being omitted.

Figure 2:
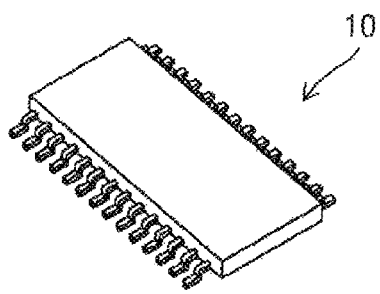
FIG. 2 is a brief appearance diagram of a driver integrated circuit (IC) according to the fundamental embodiment of the present invention.

FIG. 2 shows a brief appearance diagram of the driver IC 10. The driver IC 10 is an electronic component formed by packaging a semiconductor IC in a housing (a package housing) made of resin. In the semiconductor IC, a circuit group integrated by semiconductor includes the logic control circuit 11, the gate driver circuit 12 and the temperature determination circuit 13. The housing of the driver IC is provided with multiple external terminals exposed on the outside of the driver IC 10. Further, the number of the external terminals of the driver IC 10 shown in FIG. 2 is merely an example.

The multiple external terminals provided at the driver IC 10 include gate connecting terminals G[1] to G[4], source connecting terminals S[1], S[2] and $S_{COM}$, an external terminal TM1 (a temperature signal terminal) for receiving an original temperature signal Sa, external terminals TM2 and TM3 for receiving driving control signals PWM1 and PWM2, a communication terminal TM4, and a power input terminal TM5 for receiving a specified DC power voltage VCC (e.g., 5 V). Further, an external terminal for receiving a reset signal and an external terminal correspondingly grounded are also provided at the driver IC 10. The communication terminal TM4 is formed by multiple external terminals. The control logic circuit 11 and the temperature determination circuit 13 are driven based on the power voltage VCC.

The output transistors M[1] to M[4] respectively form N-channel MOSFETs. Although not depicted, in the MOSFET forming each output transistor, a parasitic diode with respect to the source towards the drain of the MOSFET as a forward direction is connected with the MOSFET in parallel. Further, in one variation, the output transistors M[1] and M[2] can also be formed by P-channel MOSFETs.

In the structure in FIG. 1, the output transistors M[1] to M[4] form a full bridge circuit (an H bridge circuit) with respect to the motor 40. At this point, the output transistors M[1] and M[2] serve as high-side transistors and exercise functions thereof, and the output transistors M[3] and M[4] serve as low-side transistors and exercise functions thereof.

More specifically, the drains of the output transistors M[1] and M[2] are connected to a power line to be applied by a specified positive power voltage VPWR (e.g., 12 V), and the sources of the output transistors M[3] and M[4] are connected to ground. The source of the output transistor M[1] and the drain of the output transistor M[3] are commonly connected to a node NDa, and the source of the output transistor M[2] and the drain of the output transistor M[4] are commonly connected to a node NDb. The motor 40 is connected between the nodes NDa and NDb. When current flows from the node NDa through the motor 40 towards the node NDb, the motor 40 rotates in a first rotation direction (the rotation is to be referred to as clockwise rotation); when current flows from the node NDb through the motor 40 towards the node NDa, the motor 40 rotates in a second rotation direction opposite to the first rotation direction (the rotation is to be referred to as counterclockwise rotation). The gates of the output transistors M[1] to M[4] are respectively connected to the gate connecting terminals G[1] to G[4] of the driver IC 10. The sources of the output transistors M[1] and M[2] are respectively connected to the source connecting terminals S[1] and S[2] of the driver IC 10. The sources of the output transistors M[3] and M[4] are commonly connected to the source connecting terminal $S_{COM}$.

The gate driver circuit 12 is a circuit for driving the gates of the output transistors M[1] to M[4], and include individual driver circuits 12[1] to 12[4] for individually driving the gates of the output transistors M[1] to M[4]. The individual driver circuits 12[1] to 12[4] are respectively connected to the corresponding gate connecting terminals and source connecting terminals. The gate connecting terminals corresponding to the individual driver circuits 12[1] to 12[4] are respectively the gate connecting terminals G[1] to G[4]. The source connecting terminals corresponding to the individual driver circuits 12[1] and 12[2] are respectively the source connecting terminals S[1] and S[2], and the source connecting terminals corresponding to the individual driver circuits 12[3] and 12[4] are respectively the source connecting terminal $S_{COM}$.

The individual driver circuits 12[1] to 12[4] drive, under the control of the control logic circuit 11, the gates of the output transistors M[1] to M[4]. VG[1] to VG[4] are used to respectively represent gate voltages of the output transistors M[1] to M[4]. The individual driver circuits 12[1] to 12[4] can switch-drive the output transistors M[1] to M[4] by switching the corresponding gate voltages VG[1] to VG[4] between low level and high level.

An internal power voltage VCP serving as a high-side driving voltage is supplied to the individual driver circuits 12[1] and 12[2], and an internal power voltage Vreg serving as a low-side driving voltage is supplied to the individual driver circuits 12[3] and 12[4]. The internal power voltage VCP is generated from boosting a specified DC voltage provided by the driver IC 10 by using such as a charge pump circuit. The internal power voltage Vreg is the DC voltage itself, or is generated from the DC voltage in the driver IC 10. The internal power voltage VCP is higher than the power voltage VPWR, and a difference between the voltages VCP and VPWR is fully greater than gate threshold voltages of the output transistors M[1] and M[2]. Therefore, the individual driver circuits 12[1] and 12[2] are capable of rendering the output transistors M[1] and M[2] to be conducted by using the voltage VCP. The voltage Vreg is fully greater than gate threshold voltages of the output transistors M[3] and M[4]. Therefore, the individual driver circuits 12[3] and 12[4] are capable of rendering the output transistors M[3] and M[4] to be conducted by using the voltage Vreg.

The control logic circuit 11 can bi-directionally communicate with the MPU 20 by using the communication terminal TM4. The bi-directional communication between the control logic circuit 11 and the MPU 20 is implemented by, for example, Serial Peripheral Interface (SPI).

Further, the driving control signals PWM1 and PWM2 are provided from the MPU 20 to the logic control circuit 11. The driving control signal PWM1 is a pulse modulation signal (PWM) of a first half bridge circuit including the output transistors M[1] and M[3], and the driving control signal PWM2 is a pulse modulation signal (PWM) of a second half bridge circuit including the output transistors M[2] and M[4].

The output transistors M[1] and M[3] are PWM driven by the individual driver circuits 12[1] and 12[3] according to the driving control signal PWM1, and the output transistors M[2] and M[4] are PWM driven by the individual transistors 12[2] and 12[4] according to the driving control signal PWM2. The driving control signals PWM1 and PWM2 are respectively digital signals designated with a low level or a high level.

When the driving control signal PWM1 is at high level, the gate voltages VG[1] and VG[3] respectively become high level and low level by using the individual driver circuits 12[1] and 12[3], and thus the output transistors M[1] and M[3] respectively become connected and disconnected. When the driving control signal PWM1 is at low level, the gate voltages VG[1] and VG[3] respectively become low level and high level by using the individual driver circuits 12[1] and 12[3], and thus the output transistors M[1] ad M[3] respectively become disconnected and connected. However, when the driving control signal PWM1 switches from low level to high level, from the moment of switching through a specified delay period, switching the gate voltage VG[1] from low level to high level and switching the gate voltage VG[3] from high level to low level are performed.

Similarly, when the driving control signal PWM1 switches from high level to low level, from the moment of switching through a specified delay period, switching the gate voltage VG[1] from high level to low level and switching the gate voltage VG[3] from low level to high level are performed.

When the driving control signal PWM2 is at high level, the gate voltages VG[2] and VG[4] respectively become high level and low level by using the individual driver circuits 12[2] and 12[4], and thus the output transistors M[2] and M[4] are respectively connected and disconnected. When the driving control signal PWM2 is at low level, the gate voltages VG[2] and VG[4] respectively become low level and high level by using the individual driver circuits 12[2] and 12[4], and thus the output transistors M[2] ad M[4] respectively become disconnected and connected. However, when the driving control signal PWM2 switches from low level to high level, from the moment of switching through a specified delay period, switching the gate voltage VG[2] from low level to high level and switching the gate voltage VG[4] from high level to low level are performed. Similarly, when the driving control signal PWM2 switches from high level to low level, from the moment of switching through a specified delay period, switching the gate voltage VG[2] from high level to low level and switching the gate voltage VG[4] from low level to high level are performed.

The high levels of the gate voltages VG[1] and VG[2] are consistent with the level of the internal power voltage VCP. When the gate voltages VG[1] and VG[2] are at high level, the output transistors M[1] and M[2] respectively become a connected state. The low levels of the gate voltages VG[1] and VG[2] are respectively consistent with the levels of the source connecting terminals S[1] and S[2]. When the gate voltages VG[1] and VG[2] are at low level, the output transistors M[1] and M[2] respectively become a disconnected state.

The high levels of the gate voltages VG[3] and VG[4] are consistent with the level of the internal power voltage Vreg. When the gate voltages VG[3] and VG[4] are at high level, the output transistors M[3] and M[4] respectively become a connected state. The low levels of the gate voltages VG[3] and VG[4] are consistent with the levels (i.e., a ground level) of the source connecting terminals S[3] and S[4]. When the gate voltages VG[3] and VG[4] are at low level, the output transistors M[3] and M[4] respectively become a disconnected state.

Figure 3:
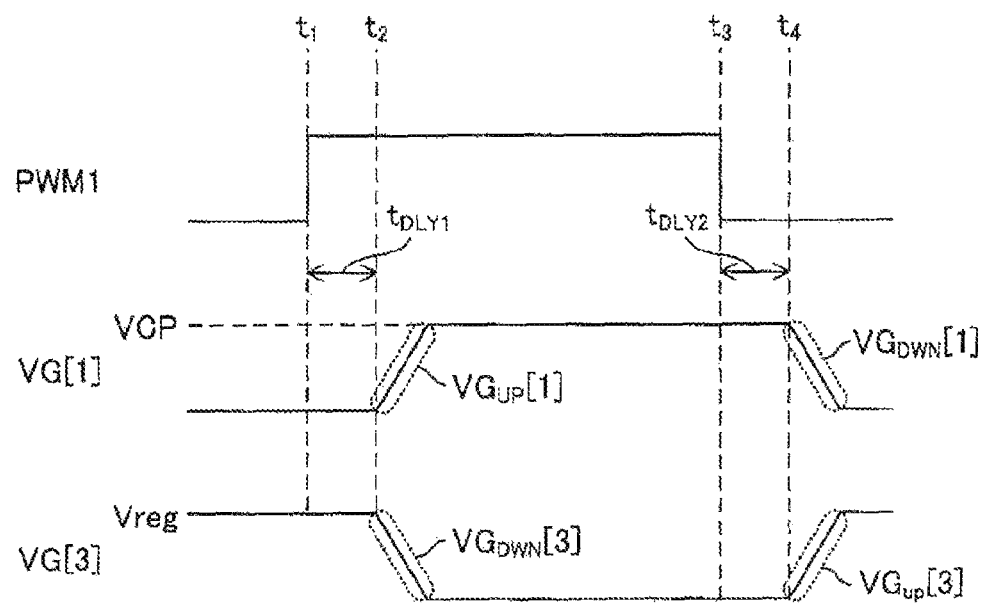
FIG. 3 is a timing diagram of a driving control signal (pulse width modulation (PWM) signal) and two gate voltages according to the fundamental embodiment of the present invention.

FIG. 3 shows a relationship of the driving control signal PWM1 with the gate voltages VG[1] and VG[3]. Taking the state in which the driving control signal PWM1 is at low level and the gate voltages VG[1] and VG[3] are respectively at low level and high level as a starting point, at a time point $t_1$, the driving control signal PWM1 is switched from low level to high level. At this point, from a time point $t_2$ (that is, a time point after a specified delay period $t_{DLY1}$ subsequent to the time point $t_1$), a transition action $VG_{UP}[1]$ of the gate voltage VG[1] from low level to high level begins, and a transition action $VG_{DWN}[3]$ of the gate voltage VG[3] from high level to low level begins. Further, in order to suppress the generation of current passing through the output transistors M[1] and M[3], the transition action $VG_{UP}[1]$ can begin slightly later than the transition action $VG_{DWN}[3]$.

The transition action $VG_{UP}[1]$ completes after a period corresponding to the slew rate of the gate voltage VG[1] subsequent to the start of the transition action $VG_{UP}[1]$, and hence the transition of the gate voltage VG[1] towards high level is complete. The transition action $VG_{DWN}[3]$ completes after a period corresponding to the slew rate of the gate voltage VG[3] subsequent to the start of the transition action $VG_{DWN}[3]$, and hence the transition of the gate voltage VG[3] towards low level is complete. Then, at a time point $t_3$ at which the gate voltages VG[1] and VG[3] are respectively at high level and low level, the driving control signal PWM1 is switched from high level to low level. At this point, from a time point $t_4$ (that is, a time point after a specified delay period $t_{DLY2}$ subsequent to the time point $t_3$), a transition action $VG_{DWN}[1]$ of the gate voltage VG[1] from high level to low level begins, and a transition action $VG_{UP}[3]$ of the gate voltage VG[3] from low level to high level begins. Further, in order to suppress the generation of current passing through the output transistors M[1] and M[3], the transition action $VG_{UP}[3]$ can begin slightly later than the transition action $VG_{DWN}[1]$.

The transition action $VG_{DWN}[1]$ completes after a period corresponding to the slew rate of the gate voltage VG[1] subsequent to the start of the transition action $VG_{DWN}[1]$, and hence the transition of the gate voltage VG[1] towards low level is complete. The transition action $VG_{UP}[3]$ completes after a period corresponding to the slew rate of the gate voltage VG[3] subsequent to the start of the transition action $VG_{UP}[3]$, and hence the transition of the gate voltage VG[3] towards high level is complete.

FIG. 3 illustrates the relationship of the driving control signal PWM1 with the gate voltages VG[1] and VG[3], and the relationship of the driving control signal PWM2 with the gate voltages VG[2] and VG[4] is similar (given that "PWM1", "[1]" and "[3]" in the description associated with FIG. 3 are replaced by "PWM2", "[2]" and "[4]").

Thus, for example, when an integer i representing any one of 1, 2, 3 and 4 is used, "$VG_{UP}[i]$" is used to represent the transition action of the gate voltage VG[i] from low level to high level, and "$VG_{DWN}[i]$" is used to represent the transition action of the gate voltage VG[i] from high level to low level. During the transition action $VG_{UP}[i]$ of the individual driver circuit 12[$i$], the gate voltage VG[i] gradually rises from a low-level potential to a high-level potential according to a specified slew rate, and the transition action $VG_{UP}[i]$ completes at a time point at which the gate voltage VG[i] reaches the high-level potential (VCP or Vreg). During the transition action $VG_{DWN}[i]$ of the individual driver circuit 12[$i$], the gate voltage VG[i] gradually drops from a high-level potential to a low-level potential according to a specified slew rate, and the transition action $VG_{DWN}[i]$ completes at a time point at which the gate voltage VG[i] reaches the low-level potential (equivalent to the source potential of the corresponding output transistor). The slew rate of the gate voltage VG[i] refers to a change rate (a slope of change) of the gate voltage VG[i] while the gate voltage VG[i] switches between low level and high level.

Herein, the individual driver circuits 12[1] to 12[4] respectively render slew rates of the gate voltages VG[1] to VG[4] to be adjustable at multiple steps. The temperature detection circuit 30, the temperature determination circuit 13 and the control logic circuit 11 participate in the setting for the slew rate, with associated description to be given later. The structural details of the individual driver circuits 12[1] to 12[4] are first described below. The individual driver circuits 12[1] to 12[4] have identical structures. Hence, the structure of an individual driver circuit 12[$i$] is described by using any one of 1, 2, 3 and 4 as an integer i.

Figure 4:
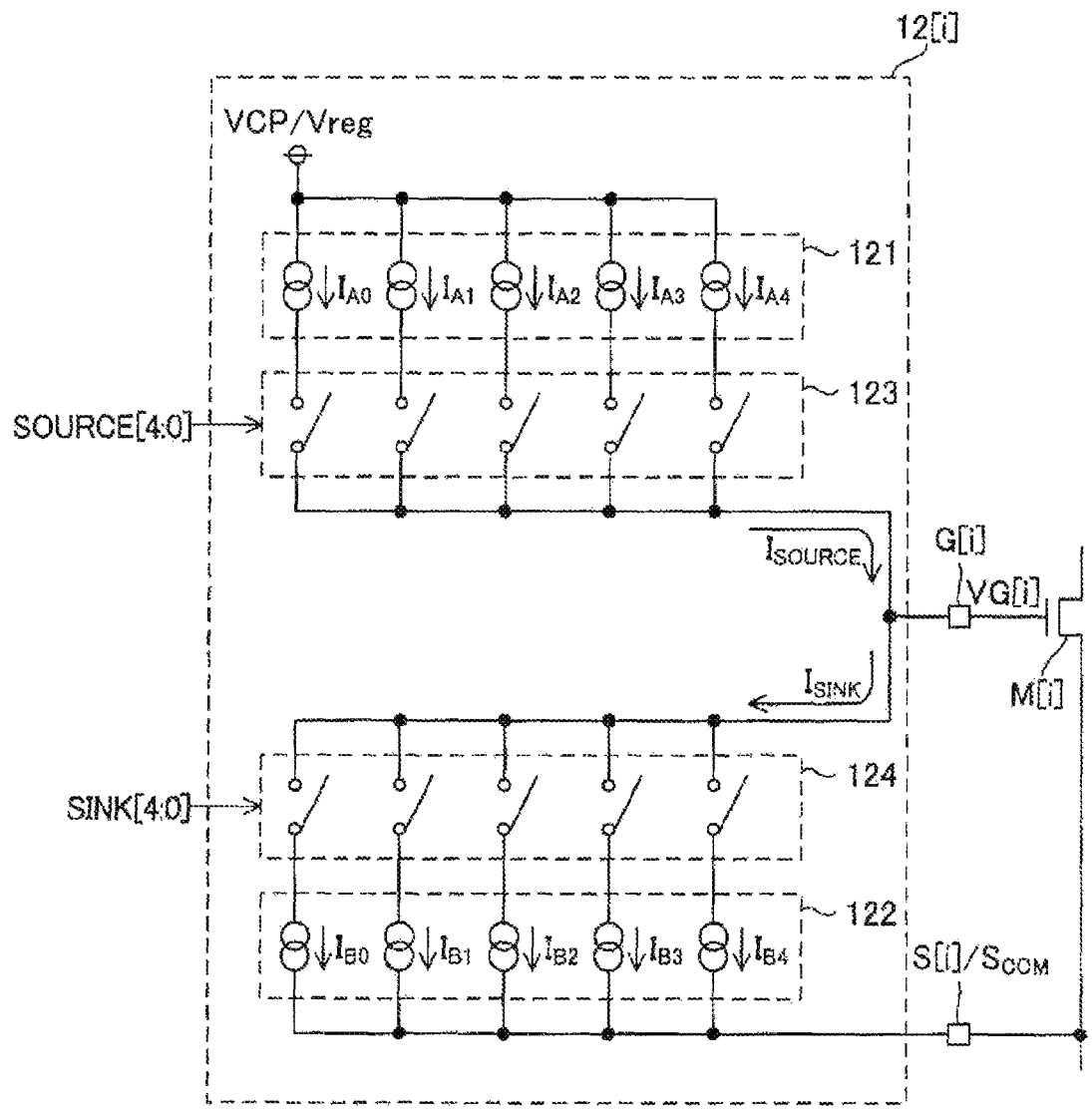
FIG. 4 is a structural schematic diagram of one individual driver circuit according to the fundamental embodiment of the present invention.

FIG. 4 shows an equivalent circuit diagram of the individual driver circuit 12[$i$]. The individual driver circuit 12[$i$] includes: a source-side current circuit 121, including five constant current sources generating source-side constant currents $I_{A0}$ to $I_{A4}$ on the basis of an internal power voltage;

and a sink-side current circuit 122, including five constant current sources generating sink-side currents $I_{B0}$ to $I_{B4}$ on the basis of an internal power voltage. The internal power voltage in regard to the individual driver circuits 12[1] and 12[2] is the voltage VCP, and the internal power voltage in regard to the individual driver circuits 12[3] and 12[4] is the voltage Vreg.

In addition, the individual driver circuit 12[$i$] further includes: a source-side switch group 123, connected in series and inserted between the gate connecting terminal G[$i$] corresponding thereto and the source-side current circuit 121; and a sink-side switch group 124, connected in series and inserted between the gate connecting terminal G[$i$] corresponding thereto and the sink-side current circuit 122. In the individual driver circuit 12[$i$], the source-side switch group 123 is formed by multiple switches provided between the circuit 121 and the terminal G[$i$], and the sink-side switch group 124 is formed by multiple switches provided between the terminal G[$i$] and the circuit 122. Any of the switches above is formed by more than one FET.

In the individual driver circuit 12[$i$], the sink-side current circuit 122 and the sink-side switch group 124 are connected in series and inserted between the corresponding gate connecting terminal G[$i$] and the corresponding source connecting terminal (S[$i$] or $S_{COM}$). As described above, the gate connecting terminals corresponding to the individual driver circuits 12[1] to 12[4] are respectively the gate connecting terminals G[1] to G[4]. The source connecting terminals corresponding to the individual driver circuits 12[1] and 12[2] are respectively the source connecting terminals S[1] and S[2], and the source connecting terminals corresponding to the individual driver circuits 12[3] and 12[4] are the source connecting terminal $S_{COM}$.

Values of the constant currents $I_{A0}$ and $I_{B0}$ are specified reference values. Values of the constant currents $I_{A1}$, $I_{A2}$, $I_{A3}$ and $I_{A4}$ are respectively set to be 2 times, 4 times, 8 times and 16 times the reference value. Values of the constant currents $I_{B1}$, $I_{B2}$, $I_{B3}$ and $I_{B4}$ are also respectively set to be 2 times, 4 times, 8 times and 16 times the reference value.

The transition action $VG_{UP}$[$i$] of the gate voltage VG[$i$] from low level to high level by using the individual driver circuit 12[$i$] is described below. During the transition action $VG_{UP}$[$i$], electric charge (positive charge) generated by any more than one of the source-side constant currents $I_{A0}$ to $I_{A4}$ is supplied from the source-side current circuit 121 to the gate connecting terminal G[$i$] and the gate of the output transistor M[$i$]. Thus, the level of the gate voltage VG[$i$] rises towards high level, and the gate voltage VG[$i$] stops rising as the level of the gate voltage VG[$i$] reaches high level (the level of the internal power voltage VCP).

During the transition action $VG_{UP}$[$i$], by using the function of the sink-side switch group 124, the gate connecting terminal G[$i$] and the gate of the output transistor M[$i$] are not connected to the sink-side current circuit 122, and thus the sink-side constant currents $I_{B0}$ to $I_{B4}$ are not circulated. Further, in the individual driver circuit 12[$i$], after the transition action $VG_{UP}$[$i$] begins till the transition action $VG_{DWN}$[$i$] subsequently begins, by using the function of the sink-side switch group 124, neither of the gate connecting terminal G[$i$] and the gate of the output transistor M[$i$] is connected to the sink-side current circuit 122, and thus the sink-side constant currents $I_{B0}$ to $I_{B4}$ are not circulated. That is to say, for example, with respect to the individual driver circuit 12[1] (referring to FIG. 3), from the time that the driving control signal PWM1 transits from low level to high level and the transition action $VG_{UP}$[1] begins, to the time that the driving control signal PWM1 transits from high level to low level and the transition action $VG_{DWN}$[1] begins, by using the function of the sink-side switch group 124, neither of the gate connecting terminal G[1] and the gate of the output transistor M[1] is connected to the sink-side current circuit 122, and thus the sink-side constant currents $I_{B0}$ to $I_{B4}$ are not circulated.

During the transition action $VG_{UP}$[$i$], by using the function of the source-side switch group 123, any one, any two, any three, any four or all of the five constant current sources generating the source-side constant currents $I_{A0}$ to $I_{A4}$ are selectively connected to the gate connecting terminal G[$i$]; as a result, any one, the total current of any two, the total current of any three, the total current of any four, or the total current of all of the source-side constant currents $I_{A0}$ to $I_{A4}$ is selectively supplied to the gate connecting terminal G[$i$].

The denotation "$I_{SOURCE}$" is used to refer to the current supplied from the source-side current circuit 121 through the source-side switch group 123 to the gate connecting terminal G[$i$] during the transition action $VG_{UP}$[$i$]. Herein, for more specific description, the value of the constant current $I_{A0}$ is set as 1 mA. Hence, by using the combination of the constant currents $I_{A0}$ to $I_{A4}$, during the transition action $VG_{UP}$[$i$], the current $I_{SOURCE}$ within a 1 mA to 31 mA range can be supplied to the gate connecting terminal G[$i$], and the current $I_{SOURCE}$ can be adjusted by a scale unit of 1 mA. During the transition action $VG_{UP}$[$i$], if the current $I_{SOURCE}$ becomes n times, the slew rate of the gate voltage VG[$i$] also becomes n times (where n is an integer or a fraction).

The value of the current $I_{SOURCE}$ is designated and set by a slew rate control signal SOURCE[4:0] provided from the control logic circuit 11 to the individual driver circuit 12[$i$]. The slew rate control signal SOURCE[4:0] is formed by a 5-bit digital signal. The slew rate of the gate voltage VG[$i$] in the transition action $VG_{UP}$[$i$] is set by setting the value of the current $I_{SOURCE}$.

The transition action $VG_{DWN}$[$i$] of the gate voltage VG[$i$] from high level to low level by using the individual driver circuit 12[$i$] is described below. During the transition action $VG_{DWN}$[$i$], electric charge (positive charge) generated by more than any one of the sink-side constant currents $I_{B0}$ to $I_{B4}$ is drawn from the output transistor M[$i$] by the sink-side current circuit 122. Thus, the level of the gate voltage VG[$i$] drops towards low level, and the gate voltage VG[$i$] stops dropping as the level of the gate voltage VG[$i$] reaches low level (equivalent to the source potential of the output transistor).

During the transition action $VG_{DWN}$[$i$], by using the function of the source-side switch group 123, the gate connecting terminal G[$i$] and the gate of the output transistor M[$i$] are not connected to the source-side current circuit 121, and thus the source-side constant currents $I_{A0}$ to $I_{A4}$ are not circulated. Further, in the individual driver circuit 12[$i$], after the transition action $VG_{DWN}$[$i$] begins till the transition action $VG_{UP}$[$i$] subsequently begins, by using the function of the source-side switch group 123, neither of the gate connecting terminal G[$i$] and the gate of the output transistor M[$i$] is connected to the source-side current circuit 121, and thus the source-side constant currents $I_{A0}$ to $I_{A4}$ are not circulated. That is to say, for example, with respect to the individual driver circuit 12[3] (referring to FIG. 3), from the time that the driving control signal PWM1 transits from low level to high level and the transition action $VG_{DWN}$[3] begins, to the time that the driving control signal PWM1 transits from high level to low level and the transition action $VG_{UP}$[3] begins, by using the function of the source-side switch group 123, neither of the gate connecting terminal G[3] and the gate of the output transistor M[3] is connected to the source-side current circuit 121, and thus the source-side constant currents $I_{A0}$ to $I_{A4}$ are not circulated.

During the transition action $VG_{DWN}[i]$, by using the function of the sink-side switch group 124, any one, any two, any three, any four or all of the five constant current sources generating the sink-side constant currents $I_{B0}$ to $I_{B4}$ are selectively connected to the gate connecting terminal G[i]; as a result, any one, the total current of any two, the total current of any three, the total current of any four, or the total current of all of the constant currents $I_{B0}$ to $I_{B4}$ selectively flows from the gate of the output transistor M[i] to the source.

The denotation of "$I_{SINK}$" refers to the current flowing from the gate of the output transistor M[i] through the gate connecting terminal G[i], the source-side switch group 124, the sink-side current circuit 122 and the corresponding source connecting terminal (S[i] or $S_{COM}$) to the source of the output transistor M[i] during the transition action $VG_{DWN}[i]$. Herein, for more specific description, the value of the constant current $I_{B0}$ is set as 1 mA. Hence, by using the combination of the constant currents $I_{B0}$ to $I_{B4}$, during the transition action $VG_{DWN}[i]$, the current $I_{SINK}$ within a 1 mA to 31 mA range can flow from the gate of the output transistor M[i] to the source, and the current $I_{SINK}$ can be adjusted by a scale unit of 1 mA. During the transition action $VG_{DWN}[i]$, if the current $I_{SINK}$ becomes n times, the slew rate of the gate voltage VG[i] also becomes n times (where n is an integer or a fraction).

The value of the current $I_{SINK}$ is designated and set by a slew rate control signal SINK[4:0] provided from the control logic circuit 11 to the individual driver circuit 12[$i$]. The slew rate control signal SINK[4:0] is formed by a 5-bit digital signal. The slew rate of the gate voltage VG[i] in the transition action $VG_{DWN}[i]$ is set by setting the value of the current $I_{SINK}$.

Figures 5A, 5B, 6:
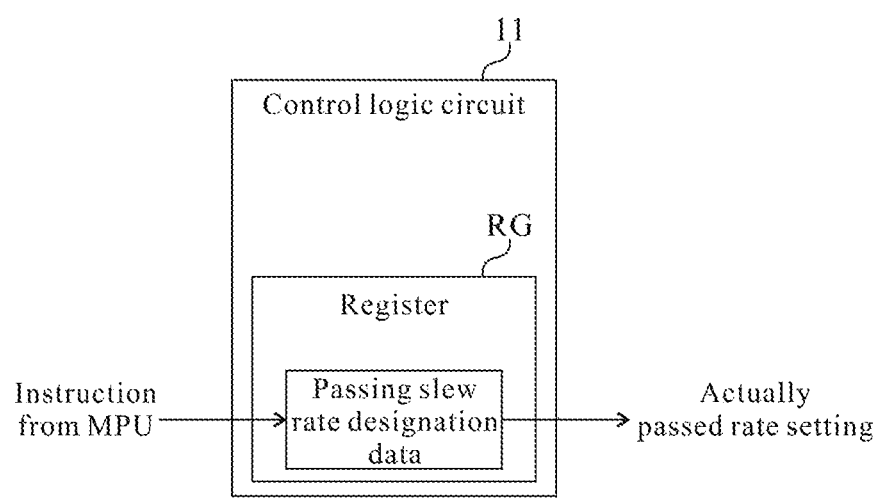
FIGS. 5(a) and (b) are diagrams representing a slew rate adjustment range according to the fundamental embodiment of the present invention.
FIG. 6 is a diagram representing a slew rate setting process according to the fundamental embodiment of the present invention.

As shown in FIGS. 5(a) and (b), $1^{st}$ to $31^{st}$ rates ($1^{st}$ to $31^{st}$ reserve rates) serve as reserves of the gate voltage VG[i] in the transition actions $VG_{UP}[i]$ and $VG_{DWN}[i]$. According to the slew rate control signal SOURCE[4:0], the slew rate of the gate voltage VG[i] in the transition action $VG_{UP}[i]$ is set as any one of the $1^{st}$ to $31^{st}$ rates; according to the slew rate control signal SINK[4:0], the slew rate of the gate voltage VG[i] in the transition action $VG_{DWN}[i]$ is set as any one of the $1^{st}$ to $31^{st}$ rates. Herein, the $(j+1)^{th}$ rate is greater than the $j^{th}$ rate, and j represents any natural number.

According to the slew rate control signal SOURCE[4:0], when the current $I_{SOURCE}$ is designated to a value within the range between 1 mA and 31 mA in a scale unit of 1 mA and is (1×j) mA, the slew rate of the gate voltage VG[i] in the transition action $VG_{UP}[i]$ becomes the $j^{th}$ rate. Similarly, according to the slew rate control signal SINK[4:0], when the current $I_{SINK}$ is designated to a value within the range between 1 mA and 31 mA in a scale unit of 1 mA and is (1×j) mA, the slew rate of the gate voltage VG[i] in the transition action $VG_{DWN}[i]$ becomes the $j^{th}$ rate. Further, in the description below, an actual slew rate of the gate voltage VG[i] is sometimes referred to as an actual slew rate.

Further, the denotation "$SR_{UP}$" is used to represent the actual slew rate in the transition actions $VG_{UP}[1]$ to $VG_{UP}[4]$. Although the driver IC 10 can also be formed by using different actual slew rates $SR_{UP}$ among the individual driver circuits 12[1] to 12[4], which however can become common by using the common slew rate control signal SOURCE[4:0] to designate the actual slew rate $SR_{UP}$ in the transition actions $VG_{UP}[1]$ to $VG_{UP}[4]$. The denotation "$SR_{DWN}$" is used to represent the actual slew rate in the transition actions $VG_{DWN}[1]$ to $VG_{DWN}[4]$. Although the driver IC 10 can also be formed by using different actual slew rates $SR_{DWN}$ among the individual driver circuits 12[1] to 12[4], which however can become common by using the common slew rate control signal SINK[4:0] to designate the actual slew rate SRDWN in the transition actions $VG_{DWN}[1]$ to $VG_{DWN}[4]$.

Referring to FIG. 6, a register RG is provided on the control logic circuit 11. According to an instruction from the MPU 20, the control logic circuit 11 writes and stores slew rate designation data in the register RG. Without any instruction from the MPU 20, the slew rate designation data is consistent with specified initial data. The slew rate designation data refers to data designating the currents $I_{SOURCE}$ and $I_{SINK}$, and the actual slew rates $SR_{UP}$ and $SR_{DWN}$ are determined by the currents $I_{SOURCE}$ and $I_{SINK}$; thus, the slew rate designation data can also be regarded as data for designating the actual slew rates $SR_{UP}$ and $SR_{DWN}$. In principle, the control logic circuit 11, under the control of the contents of the slew rate control signals SOURCE[4:0] and SINK[4:0], designates the currents $I_{SOURCE}$ and $I_{SINK}$ according to the slew rate designation data. As such, the individual driver circuit 12[$i$] then uses the currents $I_{SOURCE}$ and $I_{SINK}$ designated by the slew rate designation data (in other words, using the actual slew rates $SR_{UP}$ and $SR_{DWN}$ designated by the slew rate designation data) to perform the transition actions $VG_{UP}[i]$ and $VG_{DWN}[i]$.

However, according to an output signal from the temperature detection circuit 30 (referring to FIG. 1), sometimes the actual slew rate increases from the actual slew rate designated by the slew rate designation data. The temperature detection circuit 30 is described below.

The temperature detection circuit 30 includes a temperature detection element 31 for detecting a target temperature, and outputting a signal corresponding to the target temperature as an original temperature signal Sa (referring to FIG. 1). The original temperature Sa is inputted to the external terminal TM1. The target temperature is a temperature having a relationship with the temperature of a target transistor, and can also be understood as the temperature of a target transistor. The target transistor includes at least one output transistor of the output transistors M[1] to M[4]; herein, the output transistors M[1] to M[4] are individually target transistors. The temperature of the target transistor refers to the temperature of a specified part of the target transistor, and can also be a channel temperature of the target transistor or a housing temperature of the target transistor.

Figure 7A:
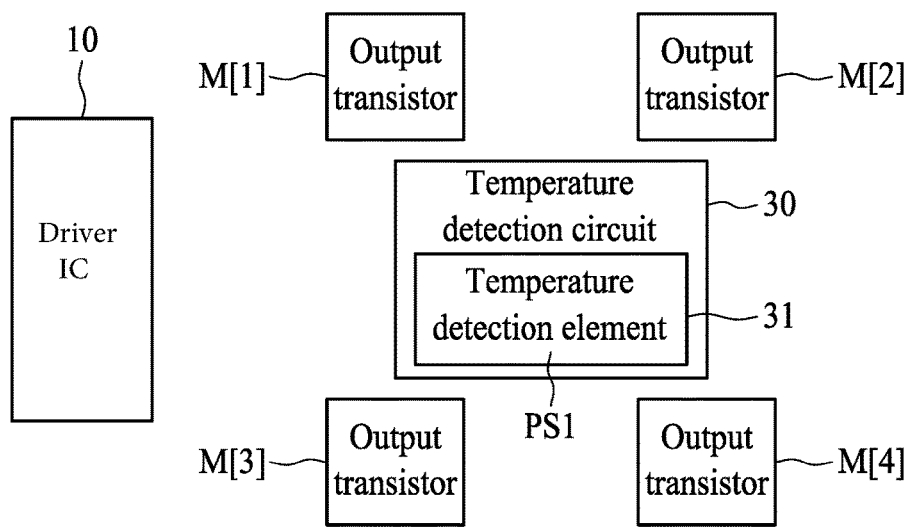
FIGS. 7(a) and (b) are diagrams illustrating a position for configuring a temperature detection element according to the fundamental embodiment of the present invention.

Due to the relationship between the target temperature and the temperature of the target transistor, the target temperature also rises as the temperature of the target transistor rises, and the target temperature also drops as the temperature of the target transistor drops. For example, as shown in FIG. 7(a), the temperature detection element 31 is configured at a position PS1, and the temperature detection circuit 30 detects the temperature at the position PS1 as the target temperature. The position PS1 is a center position or a position of center of gravity of the configuration position of each of the output transistors M[1] to M[4]. In this case, the temperature detection circuit 30 can be considered as a circuit for detecting the temperature of the target transistor as the target temperature, and the target temperature also rises or drops as the temperatures of the target transistors M[1] to M[4] rise or drop.

Figure 7B:
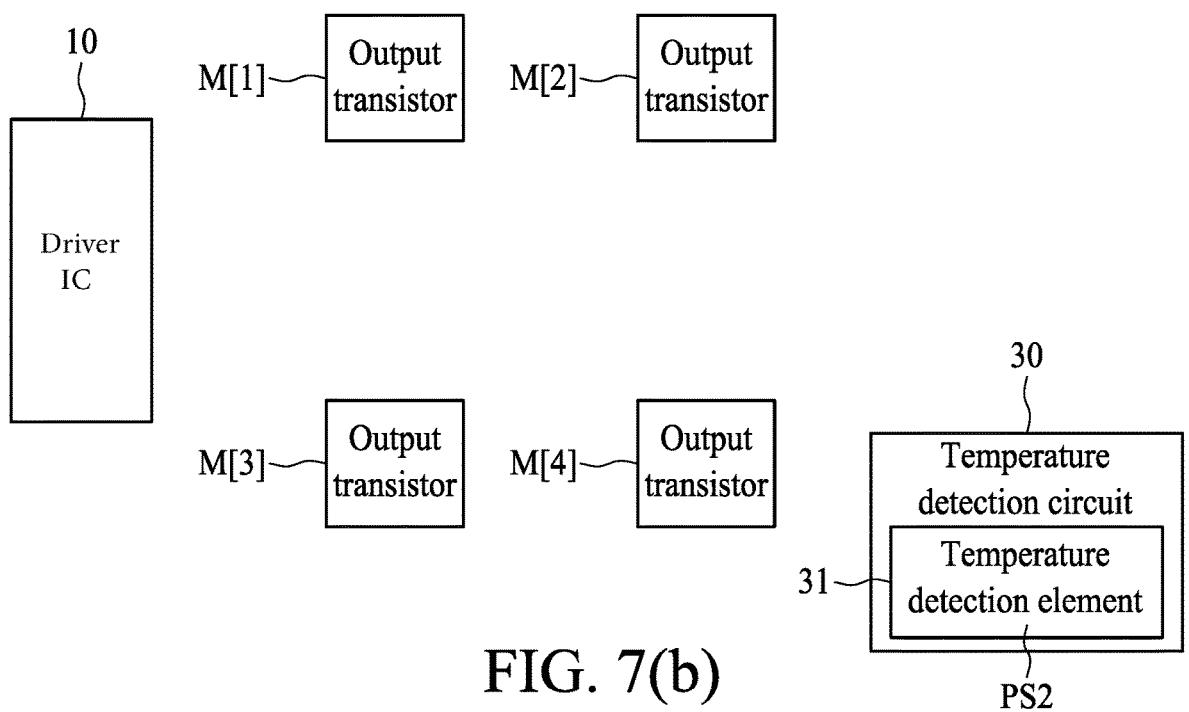

Alternatively, the temperature detection circuit 30 can be a circuit that detects the ambient temperature of the driver device as the target temperature. The driver device of the present invention is the driver IC 10 itself. However, the driver device of the present invention can also be considered as a device at least including the driver IC 10, and further including whole or part of the output transistors M[1] to M[4], the MPU 20 and the temperature detection circuit 30. For example, as shown in FIG. 7(b), the temperature detection element 31 is configured at a position PS2, and the temperature detection circuit 30 detects the temperature at the position PS2 as the target temperature. The position PS2 is any position on a substrate for mounting such as the driver IC 10 and the output transistors M[1] to M[4], and the temperature at the position PS2 is consistent with the ambient temperature of the driver device. The temperature of the target transistor (M[1] to M[4]) also rises as the ambient temperature of the driver device serving as the target temperature rises, and the temperature of the target transistor (M[1] to M[4]) also drops as the ambient temperature of the driver device drops. That is to say, these temperatures have a relationship therebetween.

The temperature detection element 31 can be any element, given that the electrical characteristics thereof changes as relative to the change in the target temperature; the temperature detection circuit 30 can also be any circuit, given that it generates and outputs a signal corresponding to the target temperature as the original temperature signal Sa. For example, a temperature detection resistor, a linear resistor, a thermistor or a diode can be used as the temperature detection element 31, or a temperature sensor forming a semiconductor IC as the temperature detection circuit 30.

Figure 8:
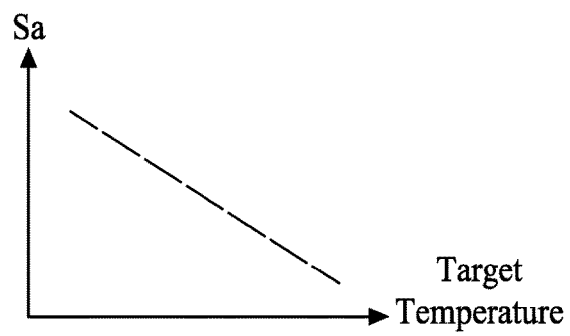
FIG. 8 is a relationship diagram of a target temperature and an original temperature signal according to the fundamental embodiment of the present invention.

However, to provide more specific description, the following condition is assumed: the original temperature signal Sa is an analog voltage signal, and as shown in FIG. 8, the voltage of the original temperature signal Sa monotonically drops as the target temperature rises (or vice versa). In FIG. 8, the example depicts that the change in the original temperature signal Sa relative to the change in the target temperature presents linearity; however, the relationship between the two can be non-linear. Further, unless otherwise specified below, the target temperature can be considered as the temperature of the target transistor.

Figure 9:
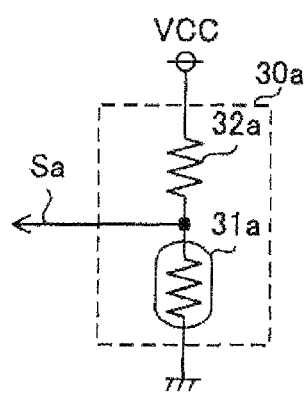
FIG. 9 is an exemplary structural schematic diagram of a temperature detection circuit according to the fundamental embodiment of the present invention.

FIG. 9 shows a temperature detection circuit 30a as an example of the temperature detection circuit 30. The temperature detection circuit 30a is formed by a serial circuit of a thermistor 31a serving as the temperature detection element 31 and a resistor 32a having constant resistance. One end of the resistor 32a is applied with the power voltage VCC, and one end of the thermistor 31a is connected to ground. The other end of the resistor 32a and the other end of the thermistor 31a are mutually commonly connected, and a signal at a connecting node of the other ends of the resistor 32a and the thermistor 31a becomes the original temperature signal Sa. If a negative temperature coefficient (NTC) thermistor having an NTC is used as the thermistor 31a, the characteristics shown in FIG. 8 can be acquired. However, in one variation, a positive temperature coefficient (PTC) thermistor having a PTC can also be used as the temperature detection element 31.

The temperature determination circuit 13 (referring to FIG. 1) is connected to the external terminal TM1, and receives the original temperature signal Sa from the temperature detection circuit 30. The temperature detection circuit 13 generates a digital determined temperature signal Sb based on the analog original temperature signal Sa, and sends the determined temperature signal Sb to the control logic circuit 11. The control logic circuit 11 performs, according to the determined temperature signal Sb and requirements, a high-temperature reactive action causing the actual slew rate to increase from the actual slew rate designated by the slew rate designation data.

In the following, an example of implementing a high-temperature reactive action, a specific example of a high-temperature reactive action, and implementation details of variations of the driver IC 10 are described in multiple embodiments below. Details already illustrated in the description associated with the fundamental embodiment, given that no special description is additionally given and in the absence of any contradiction, can be applied to the embodiments below. In the embodiments below, in case of any contradiction between the details described in the fundamental embodiment and details below, those recited in the embodiments prevail. Further, in the absence of any contradiction, details recited in any embodiment of the multiple embodiments below can also be applied to any other implementation (that is to say, any two or more embodiments in the embodiments below can be combined).

Further, in the description below, the so-called actual slew rate should be understood as both of the actual slew rates $SR_{UP}$ and $SR_{DWN}$.

First Embodiment

Figure 10:
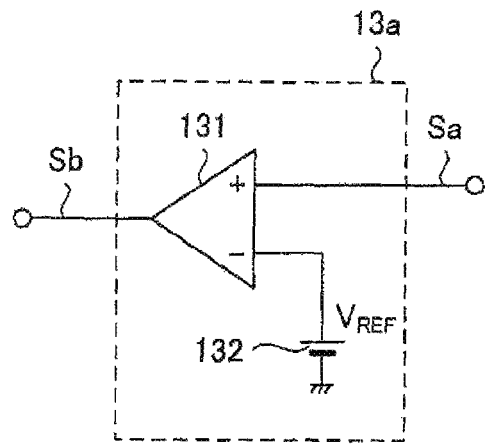
FIG. 10 is an exemplary structural schematic diagram of a temperature determination circuit according to a first embodiment of the present invention.

The first embodiment of the present invention is described below. FIG. 10 shows a circuit diagram of a temperature determination circuit 13a of the first embodiment. The temperature determination circuit 13a can be used as the temperature determination circuit 13 in FIG. 1. The temperature determination circuit 13a includes a comparator 131, and a reference voltage source 132 generating the specified reference voltage $V_{REF}$. The original temperature signal Sa is inputted to the non-inverted input terminal of the comparator 131, and the reference voltage $V_{REF}$ is inputted to the inverted input terminal of the comparator 131. An output signal from the comparator 131 becomes the determined temperature signal Sb. The determined temperature signal Sb is a binary signal assigned with a low level or a high level.

Figure 11:
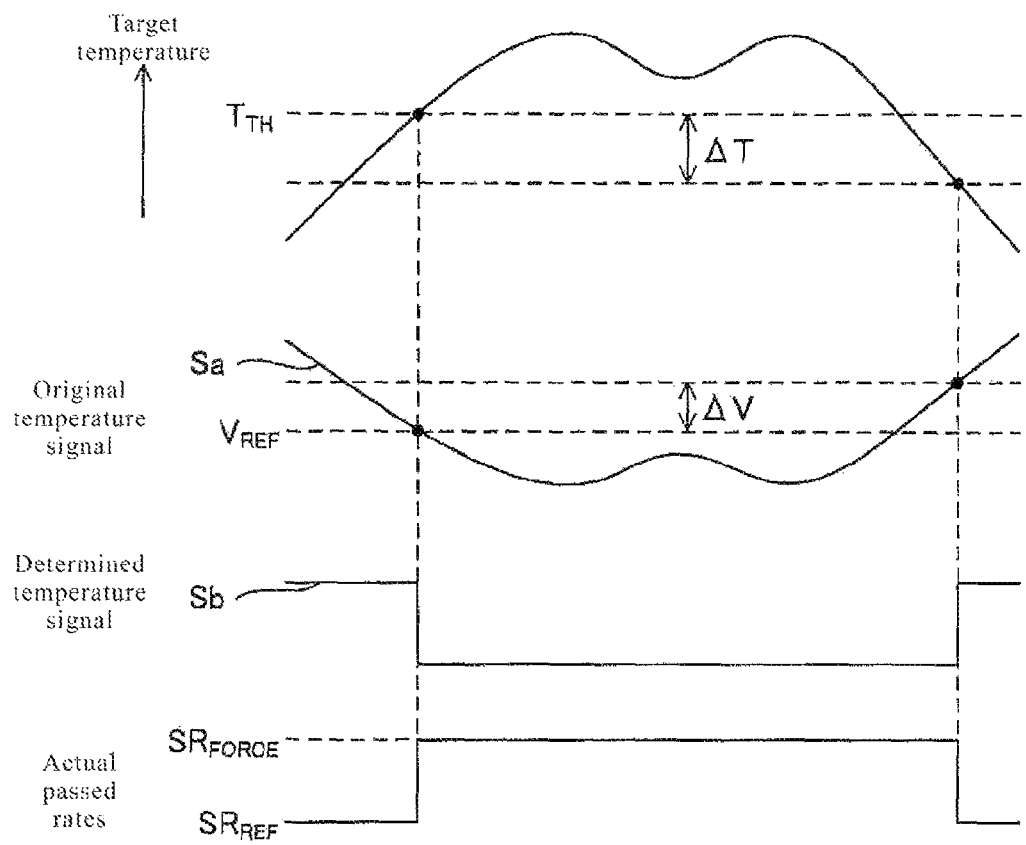
FIG. 11 is a timing diagram illustrating a relationship of a target temperature, an original temperature signal, a determined temperature signal and an actual slew rate according to the first embodiment of the present invention.

FIG. 11 shows a high-temperature reactive action of the first embodiment. In FIG. 11, "$SR_{REF}$" represents a slew rate ($SR_{UP}/SR_{DWN}$) designated by the slew rate designation data, and is referred to as a reference slew rate. The reference slew rate $SR_{REF}$ is set as a slew rate lower than the $31^{st}$ slew rate (referring to FIGS. 5(a) and (b)). The slew rate designated by the slew rate designation data includes the slew rate $SR_{UP}$ in the transition action $VG_{UP}$ and the slew rate $SR_{DWN}$ in the transition action $VG_{DWN}$, which are sometimes consistent and sometimes inconsistent with each other. However, to keep the description below simple, the two can be considered as being consistent with each other unless otherwise specified.

When the target temperature is lower than a specified determined temperature $T_{TH}$, the voltage of the original temperature signal Sa is higher than the reference voltage $V_{REF}$, and thus the determined temperature signal Sb becomes high level; when the target temperature is higher than the determined temperature $T_{TH}$, the voltage of the original temperature signal Sa is lower than the reference voltage $V_{REF}$, and thus the determined temperature signal Sb becomes low level. However, hysteresis is set in the comparator 131. As the determined temperature signal Sb temporarily correspondingly becomes low level because the target temperature exceeds the determined temperature $T_{TH}$, until the target temperature reaches below a temperature ($T_{TH}-\Delta T$) that is lower than the determined temperature $T_{TH}$ by a specified temperature $\Delta T$ (from the perspective of the temperature determination circuit 13a, until the voltage of the original temperature signal Sa reaches a voltage ($T_{REF}+$ ΔT) that is higher than the reference voltage VREF by the specified voltage ΔT), the temperature determination signal Sb is kept at low level. Further, the determined temperature $T_{TH}$ is lower than the shut-down temperature below.

When the determined temperature signal Sb is at high level, the control logic circuit 11 does not perform the high-temperature reactive action but sets the reference slew rate $SR_{REF}$ as the actual slew rate according to principles; when the determined temperature signal Sb is at low level, the control logic circuit 11 performs the high-temperature reactive action and sets a force slew rate $SR_{FORCE}$ as the actual slew rate. Herein, the force slew rate $SR_{FORCE}$ is greater than the reference slew rate $SR_{REF}$. The force slew rate $SR_{FORCE}$ can be set on the basis of the reference slew rate $SR_{REF}$, and if the reference slew rate $SR_{REF}$ is the $j^{th}$ slew rate, the force slew rate $SR_{FORCE}$ can be set as the $(j+k)^{th}$ slew rate (where k is any integer more than 1, and (j+k)≤31). Alternatively, the force slew rate $SR_{FORCE}$ can also be a predetermined rate (for example, the $31^{st}$ slew rate that is the maximum slew rate).

By suppressing the slew rate to a lower value, it is aimed to suppress electric wave radiation related to electromagnetic interference (EMI). On the other hand, the decrease in slew rate causes an increase in loss of the output transistor. Considering and comparing the above, the slew rate of the gate voltage VG[i] can be designated to a more appropriate slew rate by the MPU 20. On the other hand, in a situation where the temperature of an output transistor rises to a specified shut-down temperature, switching of the output transistor needs to be terminated due to safety concerns, such that driving of the motor 40 is accordingly terminated. However, termination of driving of the motor 40 should be avoided as much as possible. Considering the above, in the embodiment, when the target temperature (the temperature of the output transistor) correspondingly increases, the slew rate of the gate voltage VG[i] is forcibly adjusted to a higher slew rate. As a result, electric wave radiation increases but the amount of heat emitted by the output transistor decreases, such that the motor 40 can be still continuously driven to extremity even in a high temperature.

A shut-down circuit (not shown) can also be provided in the motor driver system 1 as a circuit in the driver IC 10, or as a circuit externally connected to the driver IC 10. The shut-down circuit monitors the target temperature; when the target temperature reaches the specified shut-down temperature, the shut-down circuit is not restrained by the driving control signals PWM1 and PWM2, and forcibly keeps the output transistors M[1] to M[4] as being disconnected. The driver device of the present invention can also include a shut-down circuit.

Further, the reference voltage $V_{REF}$ can be a variable voltage, and the MPU 20 can also designate the value of the reference voltage $V_{REF}$. In this case, the determined temperature $T_{TH}$ can be changed by changing the reference voltage $V_{REF}$.

Further, hysteresis is not necessarily configured in the temperature determination circuit 13 (the same applies to the other embodiments below). However, when the target temperature is about the determined temperature $T_{TH}$, hysteresis is preferably configured in order to avoid the actual slew rate from switching frequently.

Further, when the reference slew rate $SR_{REF}$ is the $31^{st}$ slew rate, regardless of the level of the determined temperature signal Sb, the high-temperature reactive action is not performed (the same applies to the embodiments below).

Second Embodiment

The second embodiment of the present invention is described below. In the first embodiment, the actual slew rate can be adjustably set by two steps according to the target temperature; however, the actual slew rate can also be adjustably set by three or more steps according to the target temperature.

Figure 12:
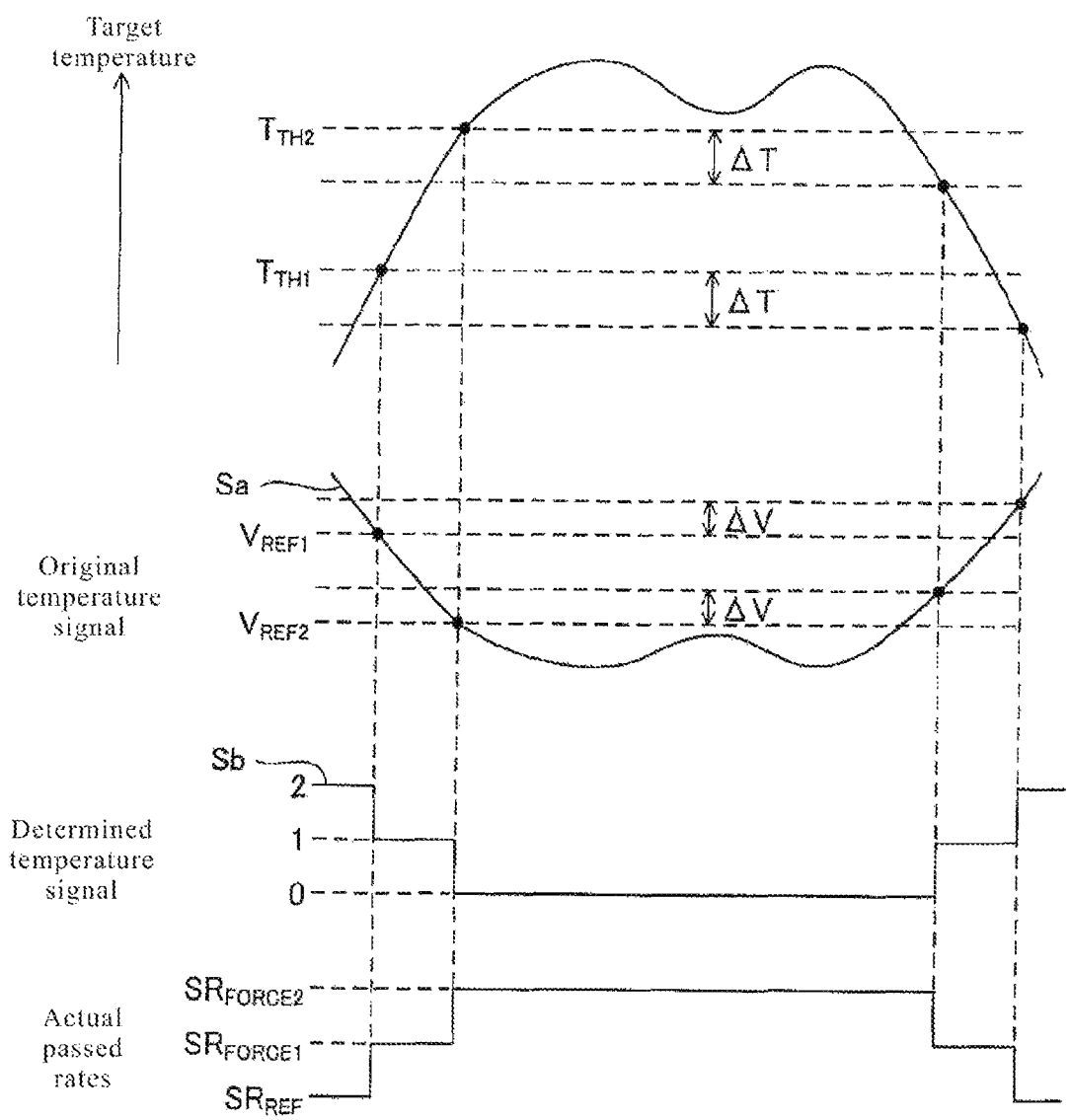
FIG. 12 is a timing diagram illustrating a relationship of a target temperature, an original temperature signal, a determined temperature signal and an actual slew rate according to a second embodiment of the present invention.

FIG. 12 shows an operation example of setting the actual slew rate by three steps according to the target temperature. In FIG. 12, the reference slew rate $SR_{REF}$ is set to a slew rate lower than the $30^{th}$ slew rate (referring to FIGS. 5(a) and (b)). In the operation example in FIG. 12, the determined temperature signal Sb is a digital signal valued "2", "1" and "0". Although not particularly depicted, the temperature determination circuit 13 of the second embodiment includes a reference voltage source generating specified reference voltages $V_{REF1}$ and $V_{REF2}$, and a comparator comparing the voltage of the original temperature signal Sa with the specified reference voltages $V_{REF1}$ and $V_{REF2}$, and outputting the determined temperature signal Sb having values "2", "1" and "0" according to the value relationship of the voltage of the original temperature signal Sa and the reference voltages $V_{REF1}$ and $V_{REF2}$. Herein, "$V_{REF1}>V_{REF2}>0$". Further, a determined temperature $T_{TH2}$ is higher than a determined temperature $T_{TH1}$, and the shut-down temperature is higher than the determined temperature $T_{TH2}$.

When the target temperature is lower than the determined temperature $T_{TH1}$, the voltage of the original temperature signal Sa is higher than the reference voltage $V_{REF1}$, and thus the value of the determined temperature signal Sb becomes "2"; when the target temperature is higher than the specified determined temperature $T_{TH1}$ but lower than the specified determined temperature $T_{TH2}$, the voltage of the original temperature signal Sa is lower than the reference voltage $V_{REF1}$ but higher than the reference voltage $V_{REF2}$, and thus the value of the determined temperature signal Sb becomes "1"; when the target temperature is higher than the determined temperature $T_{TH2}$, the voltage of the original temperature signal Sa is lower than the reference voltage $V_{REF2}$, and thus the value of the determined temperature signal Sb becomes "0".

However, hysteresis is set in the comparator of the temperature determination circuit 13. That is to say, as the value of the determined temperature signal Sb temporarily correspondingly becomes "0" because the target temperature exceeds the determined temperature $T_{TH2}$, until the target temperature reaches below a temperature $(T_{TH2}-\Delta T)$ that is lower than the determined temperature $T_{TH2}$ by a specified temperature ΔT (from the perspective of the temperature determination circuit 13, until the voltage of the original temperature signal Sa reaches a voltage $(V_{REF2}+\Delta T)$ that is higher than the reference voltage $V_{REF2}$ by the specified voltage ΔT), the value of the temperature determination signal Sb is kept at "0". Further, as the value of the determined temperature signal Sb temporarily correspondingly becomes "1" because the target temperature exceeds the determined temperature $T_{TH1}$, until the target temperature reaches below a temperature $(T_{TH1}-\Delta T)$ that is lower than the determined temperature $T_{TH1}$ by the specified temperature ΔT (from the perspective of the temperature determination circuit 13, until the voltage of the original temperature signal Sa reaches a voltage $(V_{REF1}+\Delta T)$ that is higher than the reference voltage $V_{REF1}$ by the specified voltage ΔT), the value of the temperature determination signal Sb is prohibited from crossing over to "2".

When the value of the determined temperature signal Sb is "2", the control logic circuit 11 does not perform the high-temperature reactive action but sets the reference slew rate $SR_{REF}$ as the actual slew rate according to principles; when the value of the determined temperature signal Sb is "1", the control logic circuit 11 performs a first high-temperature reactive action and sets a force slew rate $SR_{FORCE1}$ as the actual slew rate; when the value of the determined temperature signal Sb is "0", the control logic circuit 11 performs a second high-temperature reactive action and sets a force slew rate $SR_{FORCE2}$ as the actual slew rate. Herein, the force slew rate $SR_{FORCE1}$ is greater than the reference slew rate $SR_{REF}$, and the force slew rate $SR_{FORCE2}$ is greater than the force slew rate $SR_{FORCE1}$. The force slew rates $SR_{FORCE1}$ and $SR_{FORCE2}$ can be set on the basis of the reference slew rate $SR_{REF}$; if the reference slew rate $SR_{REF}$ is the $j^{th}$ slew rate, the force slew rate $SR_{FORCE1}$ can be set as the $(j+k_1)^{th}$ slew rate, and the force slew rates $SR_{FORCE2}$ can be set as the $(j+k_2)^{th}$ slew rate. Herein, $k_1$ is any integer more than 1, $k_2$ is any integer more than 2 and $k_1$, and "$(j+k_2) \leq 31$ is satisfied. Alternatively, the force slew rates $SR_{FORCE1}$ and $SR_{FORCE2}$ can be predetermined rates (more particularly the force slew rate can also be the $31^{st}$ slew rate that is the maximum slew rate).

According to the second embodiment, the actual slew rate in a high temperature increases in steps according to requirements; therefore, the actual slew rate can be suppressed from increasing beyond a limit, while the motor 40 can be continuously driven to extremity in a high temperature.

Further, the reference voltages $V_{REF1}$ and $V_{REF2}$ can be variable voltages, and the MPU 20 can also designate the values of the reference voltages $V_{REF1}$ and $V_{REF2}$. In this case, the determined temperatures $T_{TH1}$ and $T_{TH2}$ can be changed by changing the reference voltages $V_{REF1}$ and $V_{REF2}$.

Third Embodiment

The third embodiment of the present invention is described below. The motor 40 performs either of forward rotation and reverse rotation. When the motor 40 performs forward rotation, a driving current of the motor 40 flows towards the output transistors M[1] and M[4], the thus amounts of heat emitted by the output transistors M[1] and M[4] are increased; when the motor 40 performs reverse rotation, the driving current of the motor 40 flows towards the output transistors M[2] and M[3], and thus the amounts of heat emitted by the output transistors M[2] and M[3] are increased.

Figure 13:
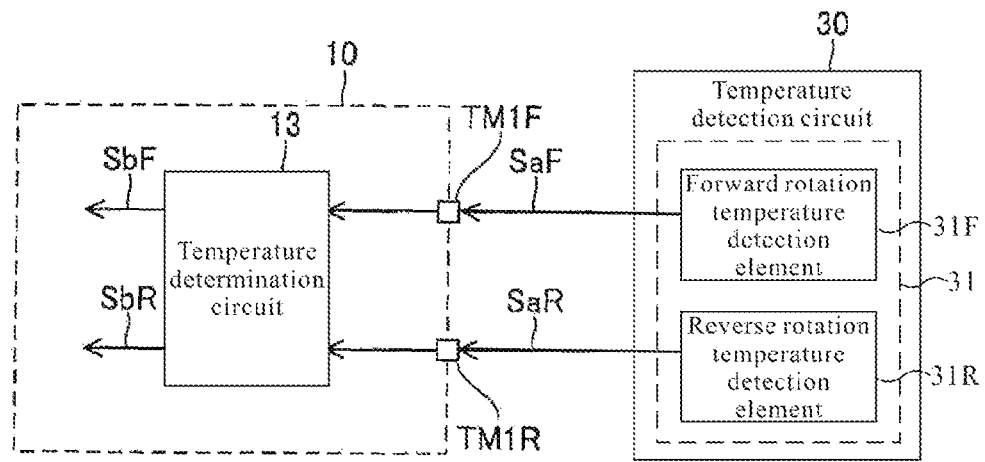
FIG. 13 is a schematic diagram of an internal structure of a temperature detection circuit, and input/output signals of the temperature detection circuit and a temperature determination circuit according to a third embodiment of the present invention.

Considering the above, as shown in FIG. 13, a forward rotation temperature detection element 31F and a reverse rotation temperature detection element 31R can be provided as the temperature detection element 31.

The forward rotation detection element 31F is a temperature detection element for detecting the temperature of a first target transistor as a first target temperature, and is, for example, thermally coupled with the first target transistor. Thus, a relationship exists between the first target temperature and the temperature of the first target transistor. The first target transistor can be understood as any one between the output transistors M[1] and M[4]. However, it is conceivable that, when the motor 40 performs forward rotation, along with the flow of the driving current of the motor 40, one of the output transistors M[1] and M[4] similarly emits heat as any one between the two emits heat. Hence, it can also be considered that each of the output transistors M[1] and M[4] is equivalent to the first target transistor.

The reverse rotation temperature detection element 31R is a temperature detection element for detecting the temperature of a second target transistor as a second target temperature, and is, for example, thermally coupled with the second target transistor. Thus, a relationship exists between the second target temperature and the temperature of the second target transistor. The second target transistor can be understood as any one between the output transistors M[2] and M[3]. However, it is conceivable that, when the motor 40 performs reverse rotation, along with the flow of the driving current of the motor 40, one of the output transistors M[2] and M[3] similarly emits heat as any one between the two emits heat. Hence, it can also be considered that each of the output transistors M[2] and M[3] is equivalent to the second target transistor.

The temperature detection circuit 30 of the third embodiment outputs a signal corresponding to the first target temperature as a first original temperature signal SaF, and outputs a signal corresponding to the second target temperature as a second original temperature signal SaR. In the third embodiment, the external terminal TM1 includes external terminals TM1F and TM1R, and the signals SaF and SaR are respectively inputted to the external terminals TM1F and TM1R. The terminals TM1F and TM1R are external terminals adjacently connected to each other. Accordingly, on the inside and outside of the driver IC 10, wiring and routing for transmitting the signals SaF and SaR can be made simple. However, one or more other external terminals can be inserted between the terminals TM1F and TM1R.

The temperature determination circuit 13 of the third embodiment generates a first determined temperature signal SbF based on the first original temperature signal SaF, and generates a second determined temperature signal SbR based on the second original temperature signal SaR. The method for generating the first determined temperature signal SbF based on the first original temperature signal SaF, and the method for generating the second determined temperature signal SbR based on the second original temperature signal SaR are identical to the method for generating the determined temperature signal Sb based on the original temperature signal Sa given in the description associated with the first or second embodiment.

The control logic circuit 11 can set the actual slew rate of forward rotation according to the first determined temperature signal SbF, and can set the actual slew rate of reverse rotation according to the second determined temperature signal SbR, by using a method same as that for setting the actual slew rate according to the determined temperature signal Sb as given in the description associated with the first or second embodiment.

Fourth Embodiment

The fourth embodiment is described below. The temperatures of the output transistors M[1] to M[4] can also be individually detected by using the temperature detection circuit 30, and the slew rates of the gate voltages VG[1] to VG[4] of the output transistors M[1] to M[4] can be individually controlled according to the individual detection results.

Figure 14:
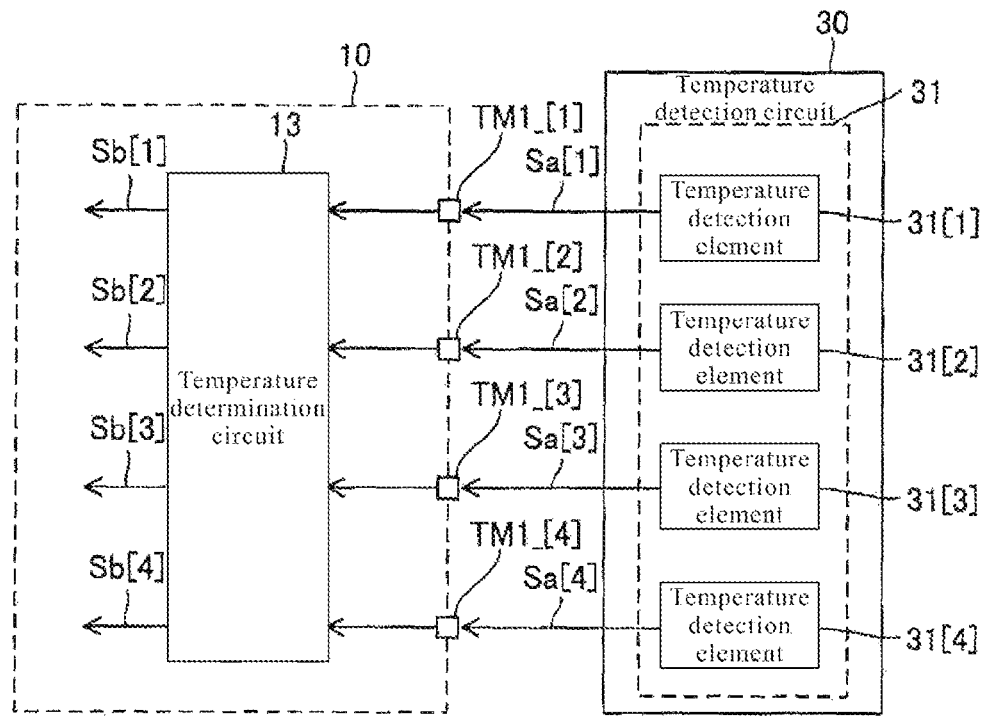
FIG. 14 is a schematic diagram of an internal structure of a temperature detection circuit, and input/output signals of the temperature detection circuit and a temperature determination circuit according to a fourth embodiment of the present invention.

In this case, as shown in FIG. 14, temperature detection elements 31[1] to 31[4] are provided as the temperature detection element 31. With respect to any integer i, the temperature element 31[i] is a temperature detection element for determining the temperature of an output transistor M[i] of an $i^{th}$ target transistor as an $i^{th}$ target temperature, and is, for example, thermally coupled with the output transistor M[i]. Thus, a relationship exists between the $i^{th}$ target temperature and the temperature of the output transistor M[i].

The temperature detection circuit 30 of the fourth embodiment outputs signals corresponding to the first to the fourth target temperatures as first to fourth original temperature signals Sa[1] to Sa[4]. In the fourth embodiment, the external terminal TM1 includes four external terminals TM1_[1] to TM1_[4], and the signals Sa[1] to Sa[4] are respectively inputted to the external terminals TM1_[1] to TM1_[4]. The external terminals TM1_[1] to TM1_[4] can be four external terminals adjacent and successive to one another. Accordingly, on the inside and outside of the driver IC 10, wiring and routing for transmitting the signals Sa[1] to Sa[4] can be made simple. However, more than one other external terminals can also be inserted between the terminals TM1_[1] to TM1_[4].

The temperature determination circuit 13 of the fourth embodiment sequentially generates determined temperature signals based on the original temperature signals. That is to say, with respect to each integer i more than 1 and less than 4, a determined temperature signal Sb[i] is generated based on an original temperature signal Sa[i]. The method for generating the determined temperature signal Sb[i] based on an original temperature signal Sa[i] is the same as the method for generating the determined temperature signal Sb based on an original temperature signal Sa in the description associated with the first or second embodiment.

With respect to each output transistor M[i], the control logic circuit 11 can use a method same as the method for setting the actual slew rate according to the determined temperature signal Sb in the description associated with the first or second embodiment to sequentially set the slew rate of the gate voltage VG[i] of the output transistor M[i] according to the determined temperature signal Sb[i]. At this point, according to the first to fourth target temperatures, the actual slew rate of the gate voltage VG[i] among the gate voltages VG[1] to VG[4] can be different. That is to say, for example, in a situation where the method of the first embodiment is used, when the first target temperature represented by the original temperature signal Sa[1] is lower than the determined temperature $T_{TH}$, and the second target temperature represented by the original temperature signal Sa[2] is higher than the determined temperature $T_{TH}$ (referring to FIG. 11), the control logic circuit 11 is capable of controlling, by using the method for rendering the actual slew rates of the gate voltages VG[1] and VG[2] to respectively become the reference slew rate $SR_{REF}$ and the force slew rate $SR_{FORCE}$, the individual driver circuits 12[1] and 12[2].

Fifth Embodiment

The fifth embodiment of the present invention is described below. The description above is given by using a full bridge circuit (an H bridge circuit) driving a DC motor as an example; however, means for driving the DC motor is not limited to the above. For example, as shown in FIG. 15, a circuit structure including four motors 40[1] to 40[4] serving as the motor 40 can be used.

Figure 15:
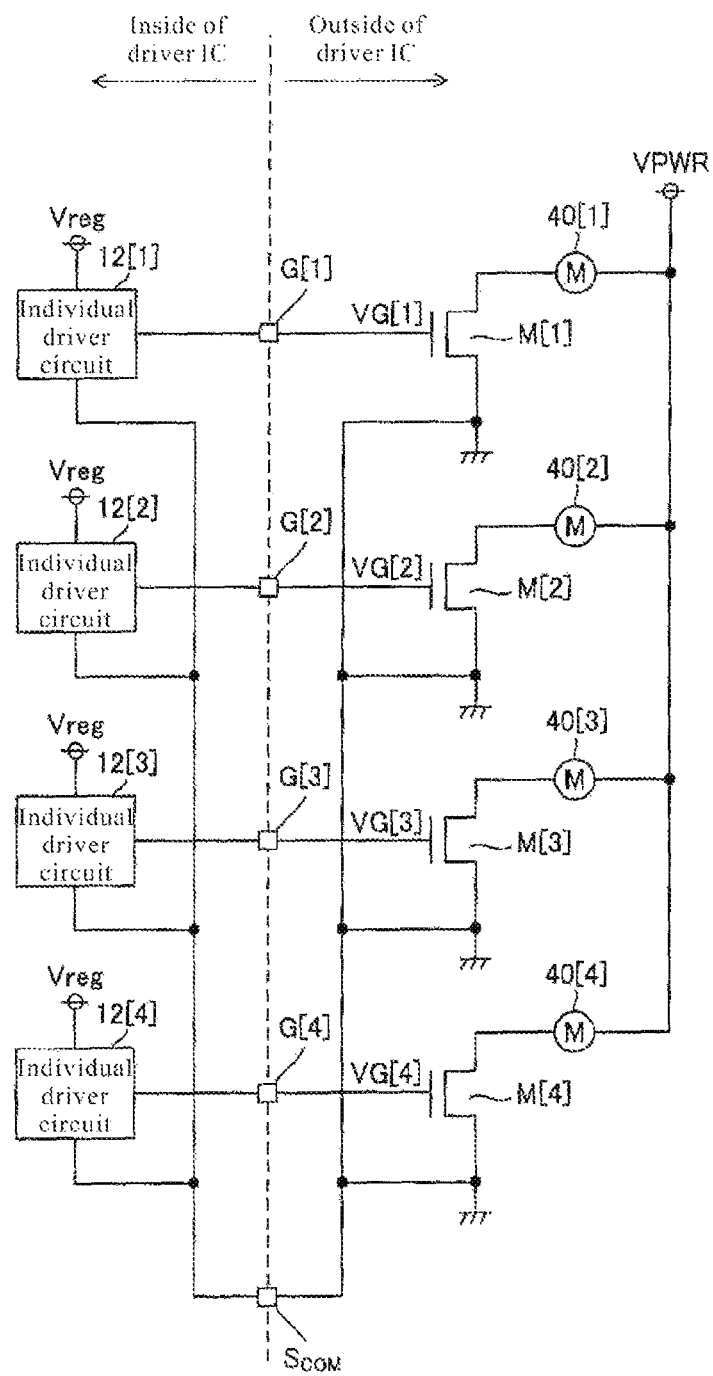
FIG. 15 is a diagram illustrating a connection relationship of multiple output transistors and multiple motors according to a fifth embodiment of the present invention.

In the structure in FIG. 15, with respect to an integer i more than 1 and less than 4, a motor 40[i] serving as a brush DC motor is connected in series and inserted between the terminal applied with the power voltage VPWR and the drain of the output transistor M[i]. The sources of the output transistors M[1] to M[4] are connected to ground, and are connected to the source connecting terminal $S_{COM}$. In the structure in FIG. 15, the internal power voltages with respect to the individual driver circuits 12[1] to 12[4] can all be the voltage Vreg, and the source connecting terminals connected to the individual driver circuits 12[1] to 12[4] are all the source connecting terminal $S_{COM}$.

Further, in the structure in FIG. 15, from the perspective of the motor 40[i], the output transistor M[i] is provided at the low potential side; alternatively, from the perspective of the motor 40[i], the output transistor M[i] is provided at the high potential side. In this case, the output transistor M[i] can also be set as a P-channel MOSFET. Anyhow, the motor 40[i] is connected in series to the output transistor M[i], the power voltage VPWR is applied to the serial circuit of the motor 40[i] and the output transistor M[i], and the current passing through the output transistor M[i] is supplied to the motor 40[i] in order to have the output transistor M[i] become conducted.

Under the control of the control logic circuit 11, the individual driver circuits 12[1] to 12[4] switch-drive the output transistors M[1] to M[4] by individually switching the corresponding gate voltages VG[1] to VG[4] between low level and high level. For the structure of the embodiment including the structure in FIG. 15, more particularly, the method described in the fourth embodiment can be applied (referring to FIG. 14); the control logic circuit 11 can individually control the slew rates of the gate voltages VG[1] to VG[4] of the output transistors M[1] to M[4] according to the signals (the original temperature signal and the determined temperature signal) corresponding to the temperature (target temperatures) of the output transistors M[1] to M[4].

Sixth Embodiment

Figure 16:
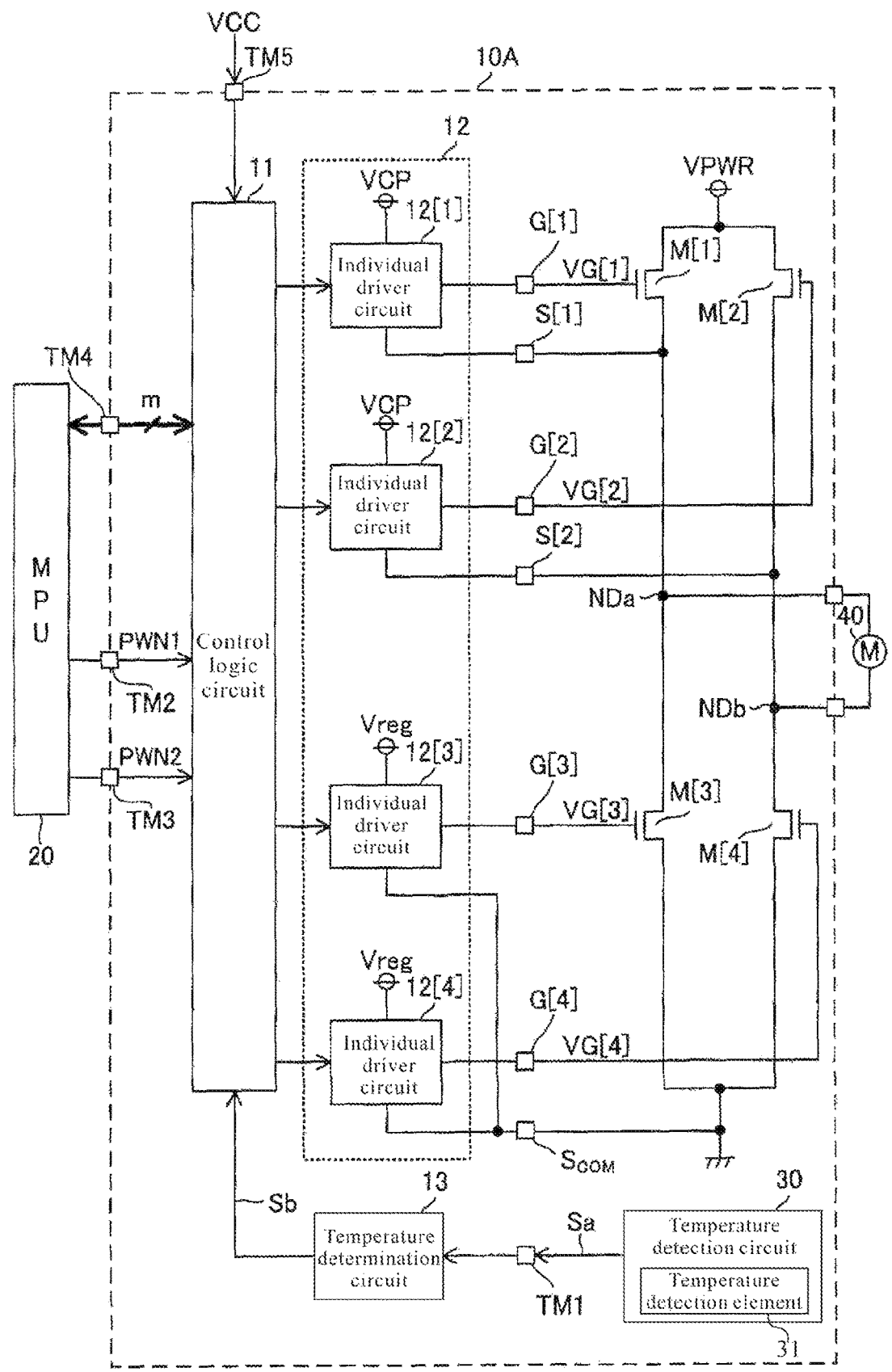
FIG. 16 is a structural schematic diagram of a motor driver system according to a sixth embodiment of the present invention.

The sixth embodiment of the present invention is described below. A type of driver IC built-in with the output transistors can also be formed. FIG. 16 shows a structure of a driver IC 10A as a variation of the driver IC 10 in FIG. 1. The driver IC 10A includes a structure built-in the output transistors M[1] to M[4] and the temperature detection circuit 30, and is identical to the driver IC 10 unless otherwise specified.

That is to say, the driver IC 10A is an electronic component formed by packaging a semiconductor IC in a housing (a package housing) made of resin. Further, in the semiconductor IC, a circuit group integrated by semiconductor includes the control logic circuit 11, the gate driver circuit 12, the temperature determination circuit 13, the output transistors M[1] to M[4] and the temperature detection circuit 30, and the circuit group is accommodated in a common housing. In the driver IC 10A, the terminals G[1] to G[4], S[1], S[2], $S_{COM}$ and TM1 become internal terminals in the driver IC 10A but are not external terminals exposed on the outside of the driver IC 10A. Correspondingly, external terminals TMa and TMb are provided at the driver IC 10A, and the motor 40 is connected between the external terminals TMa and TMb on the outside of the driver IC 10A. On the inside of the driver IC 10A, nodes NDa and NDb are respectively connected to the external terminals TMa and TMb.

In the driver IC 10A, the temperature detection circuit 30 including the temperature detection element 31 is configured near the output transistors M[1] to M[4], and outputs the original temperature signal Sa corresponding to the temperatures (target temperatures) of the output transistors M[1] to M[4]. The driver IC 10A can also include multiple IC chips. In this case, for example, an IC chip forming the output transistors M[1] to M[4] and an IC chip including the temperature detection circuit 30 may also be different chips.

However, these IC chips are accommodated in a common housing and hence form one electronic component.

Seventh Embodiment

Figure 17:
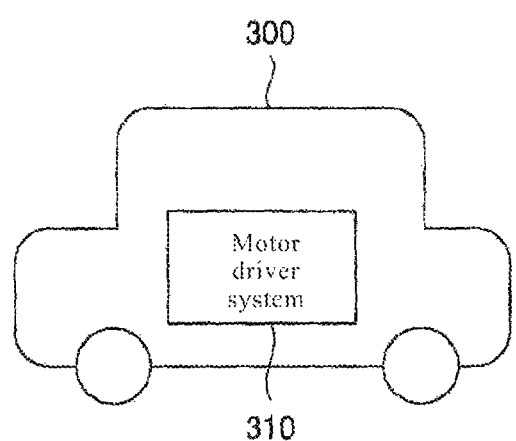
FIG. 17 is a diagram illustrating a situation where a vehicle is equipped with a motor driver system according to a seventh embodiment of the present invention.

The seventh embodiment of the present invention is described below. As shown in FIG. 17, a motor driver system 310 according to an embodiment of the present invention can be mounted in an automobile such as a vehicle 300. The motor driver system 310 can be a system same as the motor driver system 1 in FIG. 1, or may be a system formed as a variation of the fifth embodiment (referring to FIG. 15) or the sixth embodiment (referring to FIG. 16) and formed by applying the motor driver system 1 in FIG. 1.

The motor 40 in the motor driver system 310 can be used for any vehicle parts equipped in the vehicle 300 and needing to use a motor; for example, the vehicle part is a cooling fan, air conditioner, electric window or sliding door. Wherein, a cooling fan is used for cooling specified parts (such as batteries) equipped in the vehicle 300, and in a more ideal situation, the cooling fan is continuously driven in a high temperature until it reaches extremity. If the motor driver system 310 is applied to the cooling fan and the motor 40 is used to drive the cooling fan, the cooling fan can be continuous driven to extremity in a high temperature.

Eighth Embodiment

The eighth embodiment of the present invention is described below. In the eighth embodiment, application techniques and variation techniques applicable to the fundamental embodiment and the first to seventh embodiments are described.

In the motor driver system 1 in FIG. 1, the temperature determination circuit 13 can also be provided on the outside of the driver IC 10. In this case, in the motor driver system 1 in FIG. 1, the temperature determination circuit 13 is removed from the driver IC 10, and instead, the temperature determination circuit 13 is provided on the outside of the driver IC 10 so as to input the determined temperature signal Sb from the temperature determination circuit 13 to the external terminal TM1 (the temperature signal terminal), as a substitution for the original temperature signal Sa.

Although a structure capable of adjusting the slew rate by 31 steps is depicted (referring to FIGS. 5(a) and (b), the number of adjustable steps of the actual slew rate can be any number more than 2.

The output transistor M[i] is connected in series to the load, current passes through the output transistor M[i] and flows towards the load, and electric power is supplied to the load and hence drives the load. Throughout the description, it is assumed that the load is primarily a mono-phase brush DC motor (40). However, in the present invention, the load can be arbitrary; for example, the load can be a multi-phase DC motor such as a three-phase DC motor, a brushless DC motor, or even a relay or a solenoid.

The output transistor M[i] can also be other types of transistors other than MOSFET, for example, a junction FET or an insulated gate bipolar transistor (IGBT). However, the output transistor M[i] can be a voltage-controlled transistor (that is, a transistor in which current flowing between first and second electrodes is controlled by the voltage in a control electrode). Any arbitrary transistor includes a first electrode, a second electrode and a control electrode. In an FET, one of the first and second electrodes is the drain and the other is the source, and the control electrode is the gate.

In an IGBT, one of the first and second electrodes is a collector and the other is the emitter, and the control electrode is the gate.

For any arbitrary signal or voltage, a form without damaging the subject matter can be used, and the relationship between high level and low level thereof is inverted.

[Discussion of the Invention]

Substantive discussion of the present invention is obtained from the embodiments described.

A driver device W of the present invention is a driver device (e.g., the driver IC 10 or 10A) that switch-drives a target transistor connected to a load in series. The driver device W is characterized in including: a gate driver circuit (e.g., 12), and more particularly a circuit for controlling the gate voltage of the target transistor, configured to render a slew rate of the gate voltage to be adjustable at multiple steps while the gate voltage changes; and a slew rate setting circuit (e.g., 11), capable of adjustably setting the slew rate according to a temperature signal corresponding to the target temperature, wherein the target temperature has a relationship with the temperature of the target transistor.

Hence, the slew rate can be higher than that in a normal state when the target temperature is correspondingly higher, and as a result, the load can still be continuously driven to extremity even in a high temperature.

In the embodiments, the driver device W is the driver IC (10 or 10A) itself. However, the driver device W can also be considered as at least including the driver IC (10 or 10A), and further including all or part of the output transistors M[1] to M[4], the MPU 20 and the temperature detection circuit 30. The driver device W can be considered as a driver device with respect to the gate, or can be considered as a driver device with respect to the load. The control logic circuit 11 in the embodiments can be considered as the slew rate setting circuit included in the driver device W. However, the slew rate setting circuit in the driver device W can also be considered as a circuit including the control logic circuit 11 and the temperature determination circuit 13. The temperature signal associated with the driver device W corresponds to the original temperature signal or the determined temperature signal in the embodiments.

More specifically, the following situation may exist in the driver device W: the gate driver circuit is capable of rendering the slew rate to change among multiple rates including a first rate and a second rate greater than the first rate, and in a state where the slew rate is set as the first rate, when a specific change representing a rise in the target temperature occurs in the temperature signal, the slew rate setting circuit changes the slew rate to the second slew rate.

The specific change is a specific change occurring in the original temperature signal or the determined temperature signal of the embodiments; for example, in the operation example in FIG. 11, the specific change is the change that the voltage of the original temperature signal Sa transits from a state of being higher than the reference voltage $V_{REF}$ to a state of being lower than the reference voltage $V_{REF}$, or a change that the determined temperature signal Sb changes from high level to low level. In the operation example in FIG. 11, the first rate and the second rate respectively correspond to the reference slew rate $SR_{REF}$ and the force slew rate $SR_{FORCE}$.

Modifications can be appropriately made to the embodiments of the present invention without departing from the technical concepts defined by the claims. The embodiments above are merely examples of the embodiments of the present invention, and details and meanings of the terms of the components of the present invention are not limited by the meanings recited in the embodiments above. The specific values given in the description are merely examples, and may be changed to other values.

What is claimed is:

1. A driver device, switch-driving a target transistor connected in series to a load, and characterized in comprising: a gate driver circuit, being a circuit controlling a gate voltage of the target transistor, rendering a slew rate of the gate voltage to be adjustable at multiple steps while the gate voltage changes; and a slew rate setting circuit, adjustably setting the slew rate according to a temperature signal corresponding to a target temperature, wherein the target temperature has a relationship with a temperature of the target transistor, wherein the target temperature rises or drops as a temperature of the target transistor rises or drops, or the temperature of the target transistor rises and drops as the target temperature rises or drops.

2. The driver device according to claim 1, being characterized in that: the gate driver circuit is capable of rendering the slew rate to change among a plurality of slew rates comprising a first slew rate and a second slew rate greater than the first slew rate; and in a state where the slew rate is set as the first rate, when a specific change representing a rise in the target temperature occurs in the temperature signal, the slew rate setting circuit changes the slew rate to the second rate.

3. The driver device according to claim 1, being characterized in that: the gate driver circuit supplies electric charge to a gate of the target transistor by a constant current, or draws electric charge from the gate of the target transistor, so as to cause a state of the target transistor to switch between a disconnected state and a connected state, and to render the slew rate to be adjustable by changing a value of the constant current.

4. The driver device according to claim 2, being characterized in that: the gate driver circuit supplies electric charge to a gate of the target transistor by a constant current, or draws electric charge from the gate of the target transistor, so as to cause a state of the target transistor to switch between a disconnected state and a connected state, and to render the slew rate to be adjustable by changing a value of the constant current.

5. The driver device according to claim 1, being characterized in that: the target temperature is a temperature of the target transistor or an ambient temperature of the driver device; and the temperature signal is obtained by a temperature detection circuit connected to the driver device or provided at the driver device and used for detecting the target temperature.

6. The driver device according to claim 5, being characterized in that: a circuit group comprising the gate driver circuit and the slew rate setting circuit forms a semiconductor integrated circuit (IC); a plurality of external terminals comprising an output terminal and a temperature signal terminal are provided in a housing of the semiconductor IC; the target transistor and the temperature detection circuit are provided on the outside of the semiconductor IC; the gate driver circuit is connected to the gate of the target transistor by the output terminal;

and the temperature detection circuit is connected to the temperature signal terminal.

7. The driver device according to claim 6, being characterized in that: the original temperature signal having a voltage corresponding to the target temperature is inputted from the temperature detection circuit to the temperature signal terminal; and the slew rate setting circuit adjustably sets the slew rate according to a comparison result of the voltage of the original temperature signal inputted to the temperature signal terminal and a specified reference voltage.

8. The driver device according to claim 5, being characterized in that: a circuit group comprising the gate driver circuit, the slew rate setting circuit and the target transistor forms a semiconductor IC; and the temperature detection circuit and the target transistor are provided in a common housing.

9. The driver device according to claim 1, being characterized in that: the driver device forms a full bridge circuit capable of driving a direct-current (DC) motor relatively serving as the load; four output transistors forming the full bridge circuit respectively serve as the target transistor and exercise functions thereof; and a relationship exists between the target temperature and respective temperatures of the output transistors, the gate driver circuit controls respective gate voltages of the output transistors, and the slew rate setting circuit is capable of adjustably setting the slew rate of the respective gate voltages of the output transistors according to the temperature signal corresponding to the target temperature.

10. The driver device according to claim 1, being characterized in that: the load is a DC motor.

11. The driver device according to claim 9, being characterized in that: the DC motor is used to drive a cooling fan of specified parts.

12. The driver device according to claim 10, being characterized in that: the DC motor is used to drive a cooling fan of specified parts.

* * * * *